United States Patent
Ghai et al.

(10) Patent No.: US 9,905,307 B1
(45) Date of Patent: Feb. 27, 2018

(54) LEAKAGE CURRENT DETECTION IN 3D MEMORY

(71) Applicant: SanDisk Technologies LLC, Plano, TX (US)

(72) Inventors: Ashish Ghai, San Jose, CA (US); Lakshmi Kalpana Vakati, Fremont, CA (US); Ekamdeep Singh, San Jose, CA (US); Chang Siau, Saratoga, CA (US); Gopinath Balakrishnan, Santa Clara, CA (US); Kapil Verma, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 19 days.

(21) Appl. No.: 15/246,309

(22) Filed: Aug. 24, 2016

(51) Int. Cl.
| | |
|---|---|
| *G11C 16/34* | (2006.01) |
| *G11C 16/04* | (2006.01) |
| *G11C 16/16* | (2006.01) |
| *G11C 16/08* | (2006.01) |
| *H01L 27/11556* | (2017.01) |
| *H01L 27/11582* | (2017.01) |
| *H01L 27/24* | (2006.01) |

(52) U.S. Cl.
CPC ...... *G11C 16/3495* (2013.01); *G11C 16/0483* (2013.01); *G11C 16/08* (2013.01); *G11C 16/16* (2013.01); *H01L 27/11556* (2013.01); *H01L 27/11582* (2013.01); *H01L 27/2481* (2013.01)

(58) Field of Classification Search
CPC . G11C 16/3495; G11C 16/0483; G11C 16/08; G11C 16/16
USPC .......................................... 365/185.11, 185.17
See application file for complete search history.

(56) References Cited

U.S. PATENT DOCUMENTS

| | | | |
|---|---|---|---|
| 8,514,630 B2 | 8/2013 | Huynh et al. |
| 8,902,657 B2 | 12/2014 | Iwai et al. |
| 9,053,765 B2 | 6/2015 | Fukano |
| 9,105,349 B2 | 8/2015 | Avila et al. |
| 9,152,497 B2 | 10/2015 | Lee et al. |
| 9,202,593 B1 | 12/2015 | Magia et al. |
| 9,236,131 B1 | 1/2016 | Yuan et al. |

(Continued)

OTHER PUBLICATIONS

Samsung, "Samsung V-NAND technology: Yield more capacity, performance, endurance and power efficiency," White Paper, [www.samsung.com/semiconductor/ssd], Oct. 2014, 8 pages.

*Primary Examiner* — Alexander Sofocleous
*Assistant Examiner* — Alfredo Bermudez Lozada
(74) *Attorney, Agent, or Firm* — Vierra Magen Marcus LLP

(57) ABSTRACT

Technology is described herein for detecting a leakage current between a block select line and a conductive region that exists in multiple blocks of memory cells in a plane. The conductive region may be shared by at least one memory cell in multiple blocks. One example of the conductive region is a common source line that includes one or more local source lines and one or more global source lines. If the leakage current were to become high enough, the electrical short between the conductive region and the block select line could cause a plane level failure. If the leakage current is less than an amount that would cause a plane failure, but that indicates that the non-volatile memory device is susceptible to a plane failure, data may be moved out of the plane before the plane failure occurs. Thus, data loss may be prevented.

20 Claims, 16 Drawing Sheets

(56) References Cited

U.S. PATENT DOCUMENTS

| | | |
|---|---|---|
| 2012/0182803 A1 | 7/2012 | Shirakawa |
| 2012/0263002 A1* | 10/2012 | Huang .................. G11C 29/025 365/201 |
| 2014/0071756 A1* | 3/2014 | Iwai .................... H01L 27/1157 365/185.11 |
| 2014/0247658 A1* | 9/2014 | Hosono .................. G11C 16/24 365/185.11 |

* cited by examiner

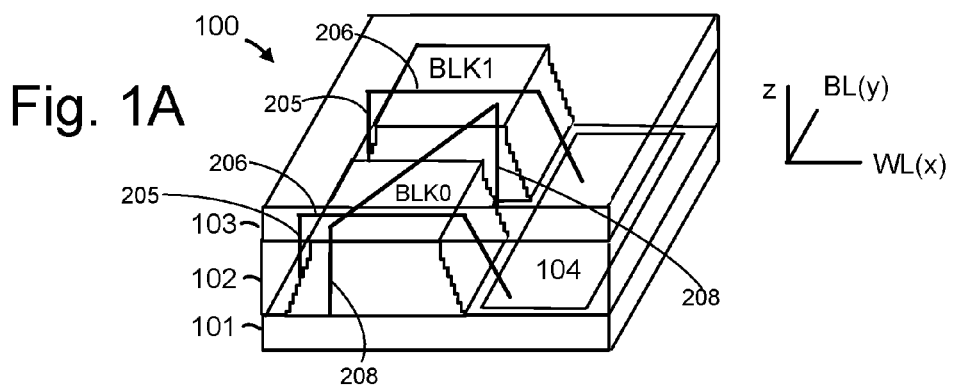
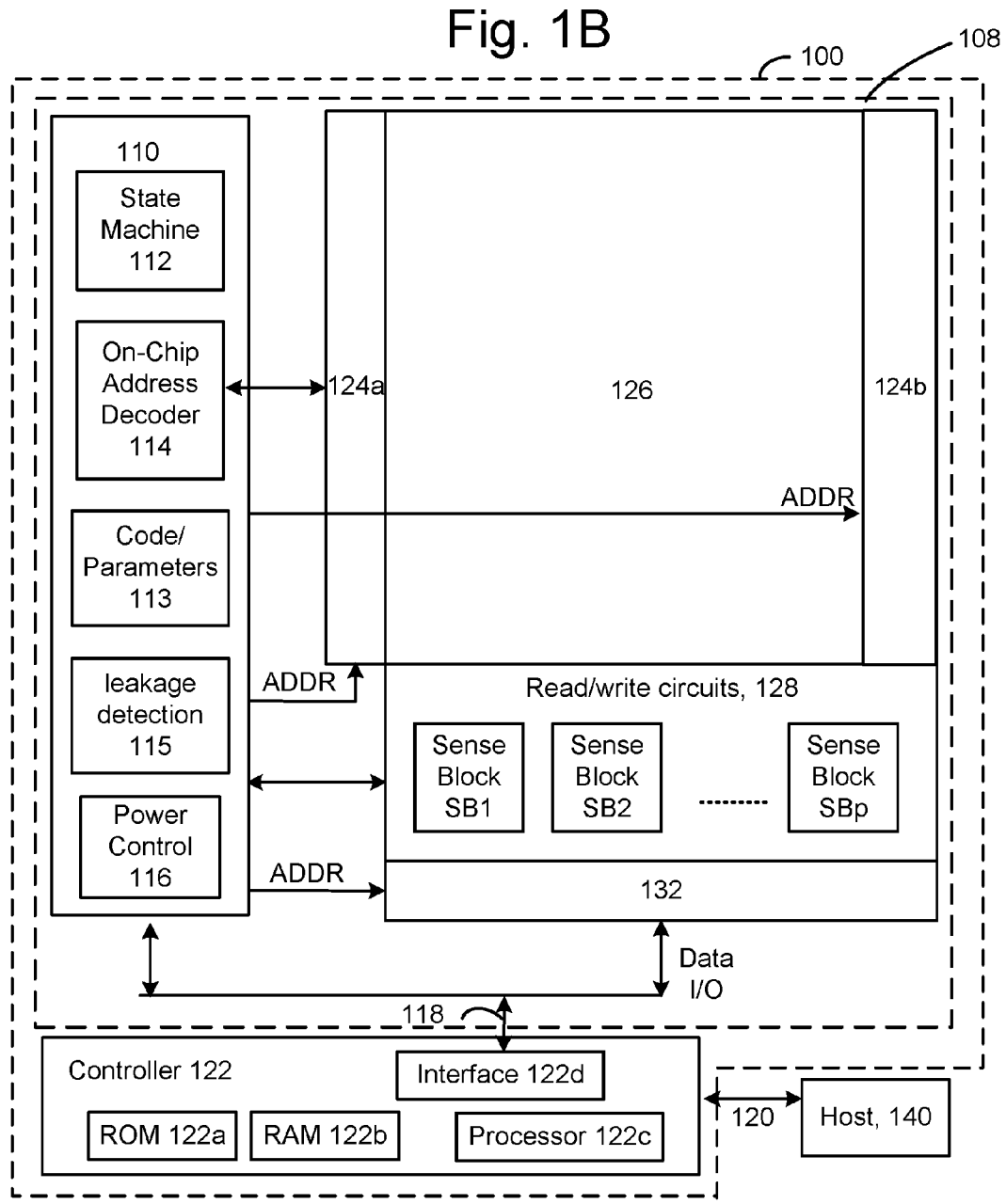

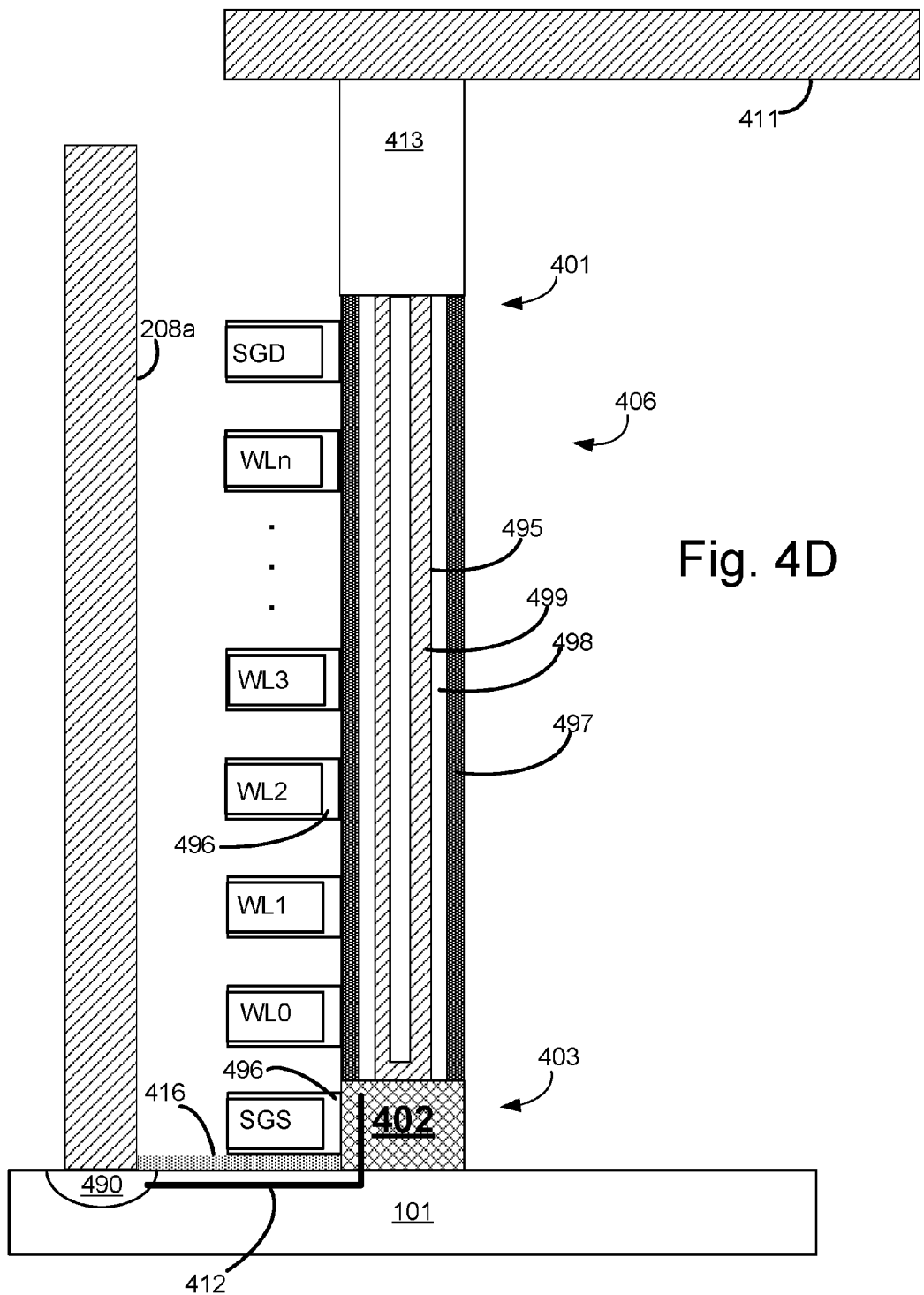

LEAKAGE CURRENT DETECTION IN 3D MEMORY

BACKGROUND

The present disclosure relates to technology for non-volatile storage.

Semiconductor memory is used in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Typically, the memory device has a memory controller and one or more memory packages. The memory package has one or more logical units. As one example, each logical unit can be a separate memory die. Each memory die contains non-volatile storage elements (e.g., memory cells), as well as read and write circuitry. The memory package also contains addressing circuitry in order to properly address the memory cells. As one example, the memory package includes NAND flash memory. However, memory packages other than NAND flash are known.

To achieve better parallelism, each logical unit in the memory package can be divided into multiple planes. A plane may be defined as a unit that is able to report its own operating status and can perform command execution independent of other planes in the logical unit. For example, each plane may have its own data registers, data buffers, etc., to enable independent command operation. As one example, a memory controller can send a multi-plane read command to the logical unit, which executes read commands in two (or more) planes in parallel. Other example multi-plane commands include, but are not limited to, multi-plane program and multi-plane erase.

BRIEF DESCRIPTION OF THE DRAWINGS

FIG. 1A is a perspective view of a 3D stacked non-volatile memory device in which embodiments may be practiced.

FIG. 1B is a functional block diagram of a memory device such as the 3D stacked non-volatile memory device of FIG. 1A.

FIG. 4D shows electrical connections between of one embodiment the NAND strings and a bit line and a local source line.

DETAILED DESCRIPTION

Figure 1C:
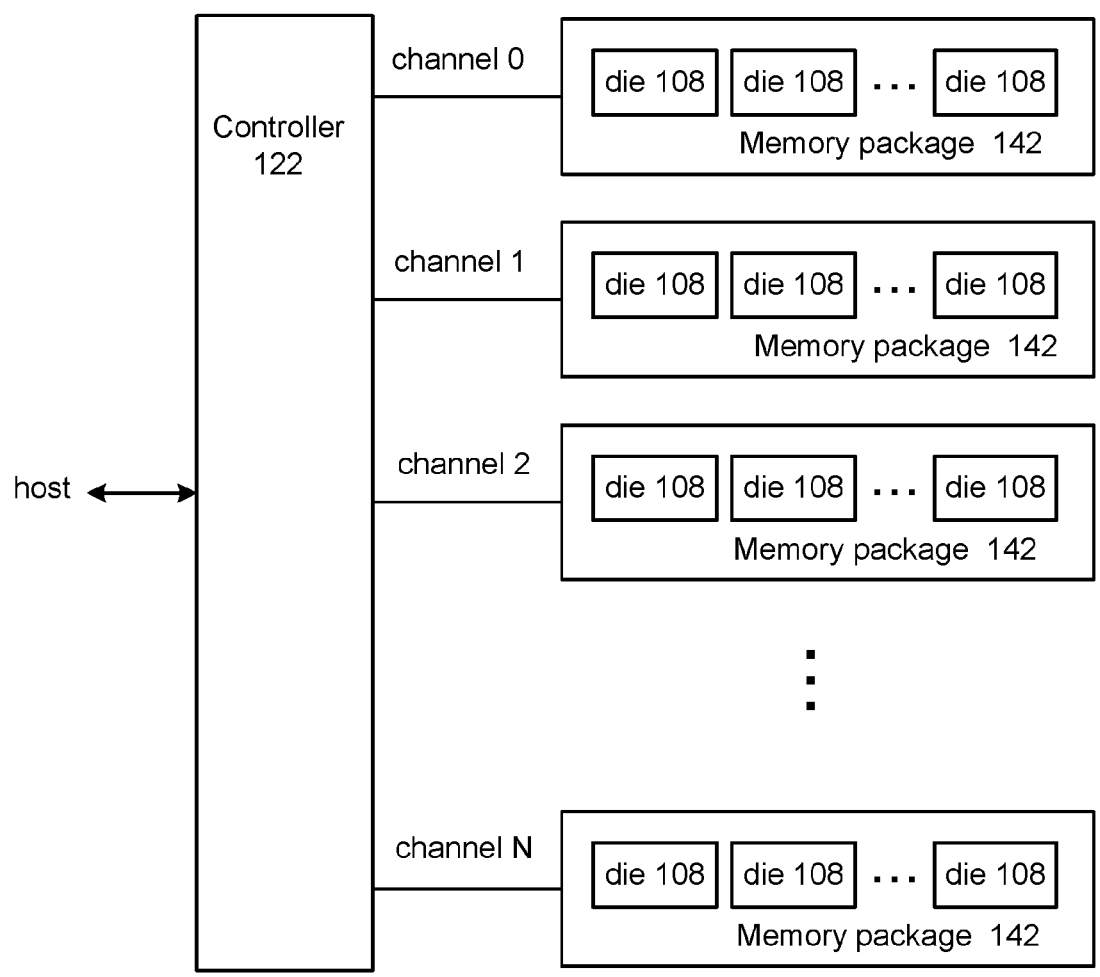
FIG. 1C show N memory packages, and N channels for communication between Controller and the memory die of respective packages.

Technology is described herein for detecting a leakage current between a block select line and a contiguous electrically conductive region (or more briefly "conductive region") that has portions in multiple blocks of memory cells in a plane. The conductive region may be shared by at least one memory cell in multiple blocks. By being shared by at least one memory cell in multiple blocks, it is meant that the conductive region may be used to simultaneously provide or sense a signal (e.g., voltage, current, etc.) to/from memory cells in different blocks.

The leakage current could become more severe over time due to, for example, charges becoming trapped in a dielectric between the block select line and the conductive region. If the leakage current were to become high enough, the electrical short between the conductive region and the block select line could cause a plane level failure. A failure refers to a part of the memory array being uncontrollable by control circuitry. Examples include, but are not limited to, the inability to read, write, or erase a part of the memory array. A plane level failure refers to an electrical short (for example) leading to a failure of multiple blocks in the plane. In contrast, some electrical shorts may only impact the block in which the electrical short (for example) exists, which may be referred to as a block level failure.

In one embodiment, the block select line extends over a top of a 3D non-volatile memory device. The block select line may be used to select/unselect blocks in a plane in the memory device. Due to running over top of the memory array, the block select line may come into close proximity with a conductive region having portions that may extend through multiple blocks in the plane. One example of the conductive region is a common source line that includes one or more local source lines and one or more global source lines. In this example, the global source line(s) may extend over multiple blocks containing memory cells. A local source line may reside within a block. A local source line may be used to provide an operating voltage to memory cells within a block. Thus, an electrical short between the block select line and any portion of the source line could impact the operating voltage in any of the blocks. Thus, the electrical short could cause a plane level failure.

In some embodiments, an electrical short is detected prior to using the memory device, in which case the plane can be retired. In some embodiments, leakage current is measured "in the field" (e.g., during customer use). In some embodiments, a leakage current detection circuit is used to test for a leakage current between a block select line and a conductive region that is shared by multiple blocks in a plane, where the leakage current is less than an amount that would cause a plane failure, but that indicates that the non-volatile memory device is susceptible to a plane failure may. In this case, data can be moved out of the plane before the plane failure occurs. Thus, data loss may be prevented.

FIG. 1A is a perspective view of a 3D stacked non-volatile memory device in which embodiments may be practiced. The memory device 100 includes a substrate 101. On and above the substrate 101 are example blocks BLK0 and BLK1 of memory cells (non-volatile storage elements). Also on the substrate is a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry.

Each block comprises a stacked area of memory cells, where alternating levels of the stack represent word lines. While two blocks are depicted as an example, additional blocks can be used, extending in the x- and/or y-directions. The z-direction represents a height of the memory device. Additionally, note that components are considered to be connected if they are directly connected or indirectly connected.

One block select line 206 is depicted for each block (BLK0, BLK1). These block select lines 206 reside in upper region 103, in this embodiment. Each block select line 206 is connected to circuitry in the peripheral area 104. The circuitry in the peripheral area 104 provides a suitable voltage to the respective block select lines 206 to select/unselect a block for a memory array operation. Each block select line 206 connects to a row decoder (not depicted in FIG. 1A) on the opposite side of the blocks from peripheral area 104. In one possible approach, each block has opposing tiered sides from which vertical contacts 205 extend upward to the upper metal layer 103 to form connections to conductive paths (such as to block select lines 206). In one embodiment, when BLK0 is selected for a memory operation BLK1 is unselected and vice versa. Typically, there are many more than two blocks.

Contiguous electrically conductive region (or more briefly, "conductive region") 208 has a portion within the intermediate region 102 (See FIG. 1A) of each block, in this embodiment. In this example, these portions are depicted as extending in the z-direction, but they could extend in a different direction in the intermediate region 102. In one embodiment, the portion of conductive region 208 in the intermediate region 102 is shaped as a vertically oriented plane. This plane can extend in the same general direction as the block select line 206. Thus, in one embodiment, conductive region 208 has a major side that forms a vertical plane that resides in the x-z plane. Such a physical structure may increase the probability of an electrical short to the block select line 206. Further details of embodiments of such a physical structure are discussed below. Because a portion of conductive region 208 is in the intermediate region 102 with the memory cells, they may be used to provide an operational signal (e.g., voltage, current) to memory cells. As one example, the portion of conductive region 208 in the intermediate region 102 is a local source line.

Conductive region 208 also has a portion in the upper region 103, which electrically connects the portions in the intermediate region 102, in one embodiment. As one example, the portion of conductive region 208 that is in the upper region 103 is a global source line. The portion of conductive region 208 that is in the upper region 103 may connect to circuitry in the peripheral area 104 in order to provide a suitable voltage to the portions in intermediate region 102 for memory array operations. In one embodiment, conductive region 208 is a common source line for NAND strings. However, the conductive region 208 is not limited to being a common source line for NAND strings.

The block select lines 206 should be electrically isolated from the conductive region 208. Note that typically there is silicon oxide or some other dielectric material to provide electrical isolation between a block select lines 206 and the conductive region 208. However, it is possible for there to be a defect in the dielectric material. Also, it is possible for the dielectric material to degrade in some manner as a result of voltages applied to the various conductive lines. For example, charges could possibly become trapped in the dielectric material. Thus, it is possible for the amount of leakage current between a block select line 206 and conductive region 208 to increase over time. This leakage current could impact the voltage on conductive lines 208. Therefore, memory operations could be impacted.

Embodiments disclosed herein are able to a detect a leakage current between a block select line 206 in upper metal layers 103 and a conductive region 208 (such as a common source line). An electrical short between the block select line 206 and the conductive region 208 could cause memory operations in both blocks (BLK0, BLK1) to fail. Hence, data is moved out of the blocks prior to the leakage current reaching a magnitude that causes memory operations to fail, in one embodiment.

FIG. 1B is a functional block diagram of a memory device such as the 3D stacked non-volatile memory device 100 of FIG. 1A. The components depicted in FIG. 1B may be electrical circuits. The memory device 100 may include one or more memory die 108. The memory die 108 includes a memory structure 126 of memory cells, such as an array of memory cells, control circuitry 110, and read/write circuits 128. The memory die 108 may include multiple planes, which will be discussed below. The memory structure 126 is addressable by word lines via a row decoder 124 and by bit lines via a column decoder 132. In a 3D configuration, the memory structure can include the blocks BLK0 and BLK1 of FIG. 1A. The read/write circuits 128 include multiple sense blocks SB1, SB2, . . . , SBp (sensing circuitry) and allow a page of memory cells to be read or programmed in parallel. In some systems, a Controller 122 is included in the same memory device 100 (e.g., a removable storage card) as the one or more memory die 108. However, in other systems, the Controller 122 can be separated from the memory die 108. In some embodiments the Controller 122 will be on a different die than the memory die. In other embodiments, a Controller can be on the same die (or same integrated circuit) as the memory. In some embodiments, one Controller 122 will communicate with multiple memory die 108. In other embodiments, each memory die 108 has its own controller.

Commands and data are transferred between the host 140 and controller 122 via a data bus 120 and between the controller and the one or more memory die 108 via lines 118. In one embodiment, the die 108 is part of a package that has pins or pads, which form part of the physical interface to the die. Certain pins (or alternatively pads) may be designated as I/O pins. In one embodiment, there are eight I/O pins (or pads). In one embodiment, there are sixteen I/O pins (or pads). However, a different number of pins may be designated as I/O pins.

Memory structure 126 can be a two dimensional structure or a three dimensional structure of memory cells (e.g., NAND flash memory cells). The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations (e.g., erase, program, read, and others) on the memory structure 126, and includes a state machine 112, an on-chip address decoder 114, leakage current detection circuit 115, and a power control module 116. The state machine 112 provides chip-level control of memory operations. Code and parameter storage 113 may be provided for storing operational parameters. In one embodiment, state machine 112 is programmable by the software stored in code and parameter storage 113. In other embodiments, state machine 112 does not use software and is completely implemented in hardware (e.g., electrical circuits).

The on-chip address decoder 114 provides an address interface between that used by the host 140 or Controller 122 to the hardware address (e.g., ADDR) used by the decoders 124a, 124b, and 132. In one embodiment, the on-chip address decoder 114 translates the address in a command from the Controller 122 such that it is compatible for the memory mapping of the memory array 126.

In one embodiment, decoders 124a, 124b are referred to as row decoders. One row decoder 124a is on the same side of the memory array 126 as the control circuitry 110. The other row decoder 124b is one the other side of the memory array 126. Thus, when providing the address (ADDR) to row decoder 124b, the lines that provide the address run over top of the memory array. In one embodiment, block select lines (BLKSEL) provide the address (ADDR). Note that the lines that provide the address (ADDR) to row decoder 124a do not need to extend over top of the memory array 126.

Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Leakage current detection circuit 115 is a circuit that detects a leakage current between a block select line (e.g., BLKSEL) and a conductive region (e.g., source line) that is shared by multiple blocks in a plane. Leakage current detection circuit 115 can be any suitable leakage current detection circuit known in the art. Some prior art leakage current detection circuits that are suitable for the system of FIG. 1B make use of a current mirror and reference current to monitor current as an indicator of leakage current; however, other types of leakage current detection circuits known in the art can be used. In one embodiment, leakage current detection 115 connects/disconnects charge pumps to various elements in the memory array 126 to enable detection of leakage currents. The technology described herein is not limited to any specific type of leakage current detection circuit. In many cases, the leakage current detection circuits are used for testing during the manufacturing stage. Peripheral circuits or the memory structure 126 can be tested for leakage current when connected to the remaining portions of the system or when isolated. In some embodiments, the memory die will be sent commands to enable the leakage current detection circuit to perform a test for leakage current.

Any one or any combination of control circuitry 110, state machine 112, decoders 114/124a/124b/132, code and parameter storage 113, leakage current detection circuit 115, power control module 116, sense blocks 150, read/write circuits 128, and Controller 122 can be considered a control circuit that performs the functions described herein.

The (on-chip or off-chip) Controller 122 (which in one embodiment is an electrical circuit) may comprise a processor 122c, ROM 122a, RAM 122b and a Memory Interface 122d, all of which are interconnected. Processor 122C is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between Controller 122 and memory die 108. For example, memory interface 122d can change the format or timing of signals, provide a buffer, isolate from surges, latch I/O, etc. Processor 122C can issue commands to control circuitry 110 (or any other component of memory die 108) via Memory Interface 122d.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Some embodiments of a non-volatile storage system will include one memory die 108 connected to one Controller 122. The memory die 108 may have multiple planes. However, other embodiments may include multiple memory die 108 in communication with one or more Controllers. Each of the memory die 108 may have multiple planes. In one example, depicted in FIG. 1C, the multiple memory die can be grouped into a set of one or more packages. Each memory package 142 includes one or more memory die 108 in communication with Controller 122. FIG. 1C show N memory packages 142, and N channels for communication between Controller 122 and the memory die 108 of respective packages. Controller 122 communicates with the host. In other embodiments, Controller 122 can communicate with any entity via a wired or wireless network (or other type of) connection.

Each memory package 142 may have a set of pins (or alternatively pads) that are configured for input and/or output. The pins (or pads) form part of the interface (FIG. 1, 118) between the controller 122 and the memory package 142. Some of the pins (or pads) may be designated as I/O pins. This may allow for commands, addresses, and data to be received from the memory controller 122, as well as for data and other information to be returned to the memory controller 122. These pins (or pads) are compliant with a version of the Open NAND Flash interface (ONFI) specification, in one embodiment. However, the pins (or pads) are not required to be compliant with any version of the ONFI specification (even if the memory package is a NAND device). Also note that the memory package 142 is not required to be a NAND device.

Controller 122 receives a request from the host to program host data (data received from the host) into the memory system. In some embodiments, Controller 122 will arrange the host data to be programmed into units of data. For example, Controller 122 can arrange the host data into pages, word line units, blocks, super blocks, or other units. Super blocks are units of data that are programmed and read together, but span across multiple memory die 108. However, other arrangements can also be used.

Figure 2:
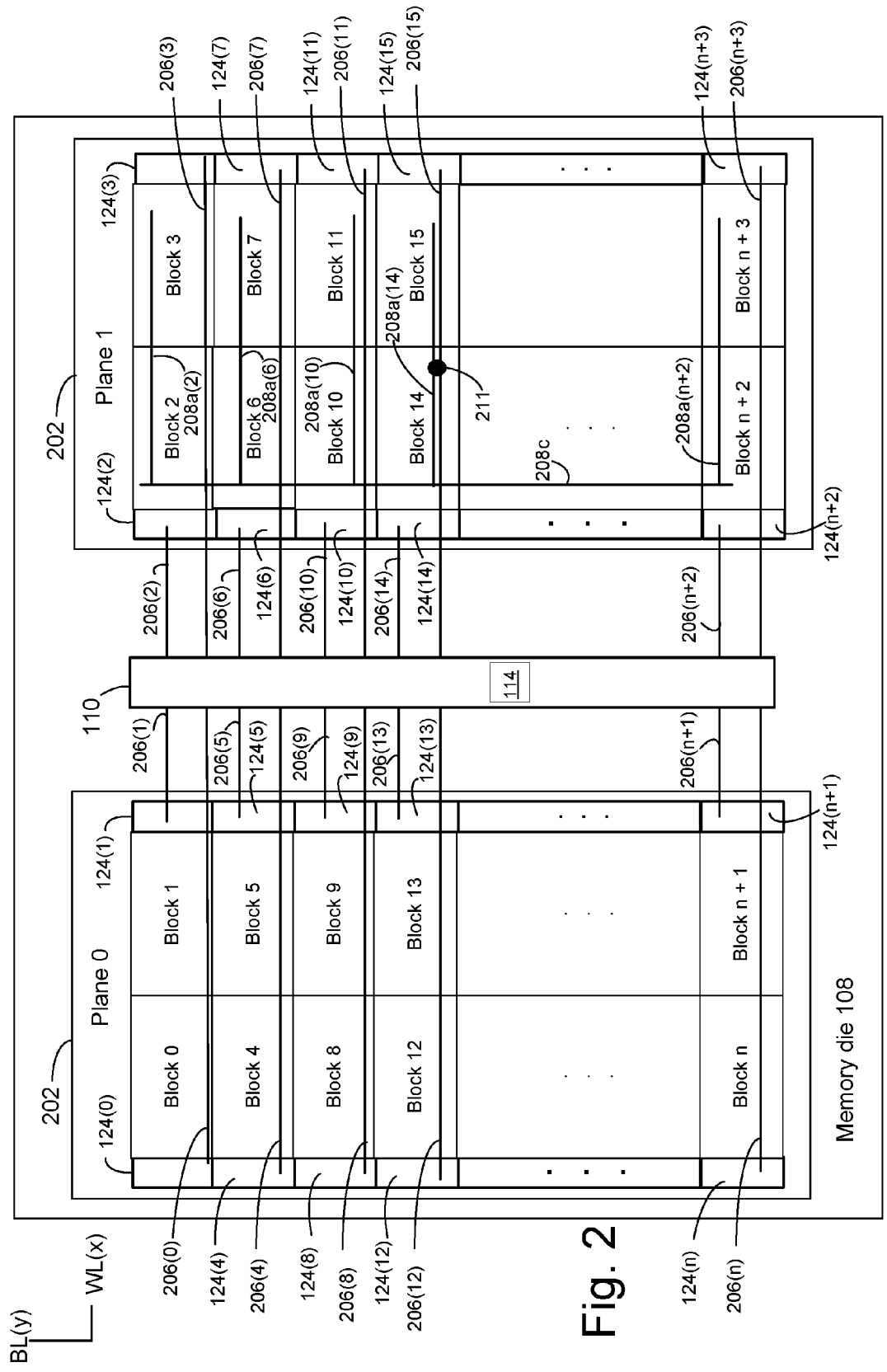
FIG. 2 depicts a diagram of another embodiment of blocks in a multi-plane memory die.

FIG. 2 depicts a diagram of embodiment of a blocks in a multi-plane memory die 108. Each block contains memory cells. The multi-plane memory die 108 has two planes 202 (Plane 0, Plane 1). In the embodiment of FIG. 2, control circuitry 110 is physically located between Plane 0 and Plane 1. Control circuitry 110 contains on-chip address decoder 114. In this example, Plane 0 has Blocks 0, 1, 4, 5, 8, 9, 12, 13, . . . n, n+1. Plane 1 has Blocks 2, 3, 6, 7, 10, 11, 14, 15, . . . n+2, n+3. The on-chip address decoder 114 may be referred to as a block decoder, as it may select one of the blocks, based on an address.

Row decoders 124(0)-124(n+3) are depicted. Each block has one row decoder 124 associated with it, in this embodiment. For example, block 0 is associated with row decoder 124(0), block 1 is associated with row decoder 124(1), etc. Blocks may be selected/unselected by the row decoders 124. In some embodiments, row decoders 124 provide operational voltages to word lines. Block select lines 206 may be used to select the various blocks. Each block select line connects to one of the row decoders, in this embodiment. For example, block select line 206(0) connects to row decoder 124(0), block select line 206(1) connects to row decoder 124(1), etc. In one embodiment, a suitable voltage is applied to a block select line 206 to select a certain block. In one embodiment, a relatively high voltage is applied to a block select line 206 to select a block and a relatively low voltage may be applied to a block select line 206 to unselect a block. In some embodiments, during a memory array operation, only one block per plane is selected at a time. Thus, one block select line 206 may be at a high voltage and the rest at a relatively low voltage. The high voltage is sufficiently high to turn on a pass transistor that provides voltages to word lines (as well as drain and source side select lines) in a selected block, in one embodiment. Herein, a "pass transistor" is defined as a transistor that is used to pass a signal (e.g., voltage) to a selected block of memory cells. Since these voltage could be fairly high, the select voltage needs to be quite high, in some embodiments. The low voltage to unselect a block might be ground or close to ground.

In this example, the controller 122 may be configured to send commands to the memory die 108 that have an address that specifies which block to access (e.g., read, write, erase). For at least some commands (e.g., read, write, erase), the command may specify a subset of memory cells in the block to access. For some commands (e.g., erase), the command could instruct that all memory cells in the selected block be accessed. The block addresses are interleaved between the two planes in this example. In this example, there are two sequential blocks in plane 0, then two sequential blocks in plane 1, etc. However, the blocks can be numbered in another manner. Also, there could be more than two planes 202. For example, there might be four, eight, or some other number of planes 202.

Each plane 202 is able to perform command execution independent of the other plane 202, in one embodiment. For example, each plane 202 may contain its own data registers (e.g., page register, cache register, data register, etc.) and other circuitry to allow such parallel execution. The data registers and other circuitry are not depicted in FIG. 2.

The even/odd block addressing scheme allows for efficient read and write operations. For example, the controller 122 can send a multi-plane write command to write Block 0 and Block 1 in parallel. Thus, two blocks that are sequentially addressed may be written in parallel. For example, while Plane 0 is writing Block 1, Plane 1 may be writing Block 2. As another example, while Plane 1 is writing Block 3, Plane 0 may be writing Block 4. However, it is not required that the two blocks in the multi-plane command have an address that differs by one. For example, while Plane 0 is writing Block 0, Plane 1 may be writing Block 7. As another example, while Plane 0 is reading one its Blocks, Plane 1 may be reading one its Blocks. As still another example, while Plane 0 is erasing one its Blocks, Plane 1 may be erasing one its Blocks.

A few local source lines 208a are depicted. In this example, each local source line 208a extends through two blocks. Another option is for each local source line 208a to be confined to a single block. In FIG. 2, local common source line 208a(2) is depicted in blocks 2 and 3, local common source line 208a(6) is depicted in blocks 6 and 7, local common source line 208a(10) is depicted in blocks 10 and 11, local common source line 208a(14) is depicted in blocks 14 and 15, and local common source line 208a(n+2) is depicted in block n+2 and n+3. Each of the local source lines 208a is contained within one of the blocks, in an alternative embodiment. Note that there may be more than one local source line 208a per block.

Also depicted is a global source line 208c, which extends over multiple blocks in the plane. For example, global source line 208c extends over blocks 2, 6, 10, 14, . . . n+2; Note that there could be more than one global source line 208c associated with these set of blocks. Also note that there may be one or more global source lines associated with the blocks in other planes. However, other global common source lines are not depicted in FIG. 2.

The global source line 208c that extends over blocks 2, 6, 10, 14, . . . n+2 is in direct electrical contact with local common source lines 208(2), 208(6), 208(10), 208(14), . . . , 208(n+2), in one embodiment. The electrical connection may be made by source line contact (not depicted in FIG. 2).

If there is a strong enough leakage current between one of the block select lines 206 and a local source line 208a, this could lead to a plane level failure. Similarly, if there is a strong enough leakage current between one of the block select lines 206 and a global source line 208c, this could lead to a plane level failure. A hypothetical electrical short 211 is shown between block select line 206(15) and local source line 208a(14). Although this electrical short exists in Block 14, potentially all blocks in the Plane 1 could be impacted. A possible reason for the plane level failure is that the voltage on local source lines 208a in multiple blocks in Plane 1 may be uncertain during memory array operations. The local source lines 208a may provide voltages to memory cells.

One possible plane level failure is an erase plane level failure. During some embodiments of erase, to erase a block of memory cells, the substrate is raised to a high voltage. This high voltage generates a GIDL current in NAND strings. This increases the channel potential of the memory cells. The control gates of the memory cells are biased to a low voltage, such as ground. This erases the memory cells. In order to raise the substrate to a sufficiently high voltage, the local source lines 208a in the plane may be biased to a high voltage. However, the electrical short 211 could allow the voltage on block select line 216(15) to impact the voltage on the local source lines 208a. This could cause prevent local source lines 208a from charging to a sufficiently high level to erase the memory cells. In other words, the substrate does not get raised to a sufficient voltage to erase the memory cells.

Note that the electrical short in this case could be between the block select line for any of the unselected blocks and any of the local source lines 208a or the global source line 208c. For example, consider the case when block 6 is being erased. At this time, a high voltage may be applied to block select line 206(6), while a low voltage (e.g., ground) may be applied to all other block select lines in Plane 1. The low voltage being applied to block select line 206(15) may prevent local common source line 208a(14) from charging up. Moreover, since local common source line 208a(14) is electrically connected to local common source line 208a(6) via global source line 208c, local common source line 208a(6) may be prevented from charging up to a high enough voltage to erase memory cells in block 6. This erase failure could also happen for all of the other blocks in Plane 1 (other than Block 14, which could have a different type of failure). Thus, the one electrical short could lead to a plane level erase failure.

Other plane level failures are possible. For example, a plane level read failure is also possible. In some embodiment, the local common source line is biased to a small positive voltage during some read operations. For example, the local common source line could be biased to about 1.2V, just as one example. The unselected block select lines could be biased to a different (e.g., lower) voltage. For example, the unselected block select lines could be grounded. Therefore, if a read of block 7 is attempted, the electrical short 211 could prevent the local common source line(s) from being charged up properly. This could possibly lead to a read error.

Other types of plane level failures might also occur. Also, the reasons for plane level failures can be different depending on how memory operations are performed. For example, reasons for plane level failures can be different depending on the voltage applied to the common source line and/or the magnitude of the voltage on the block select lines of the unselected blocks.

Figure 3:
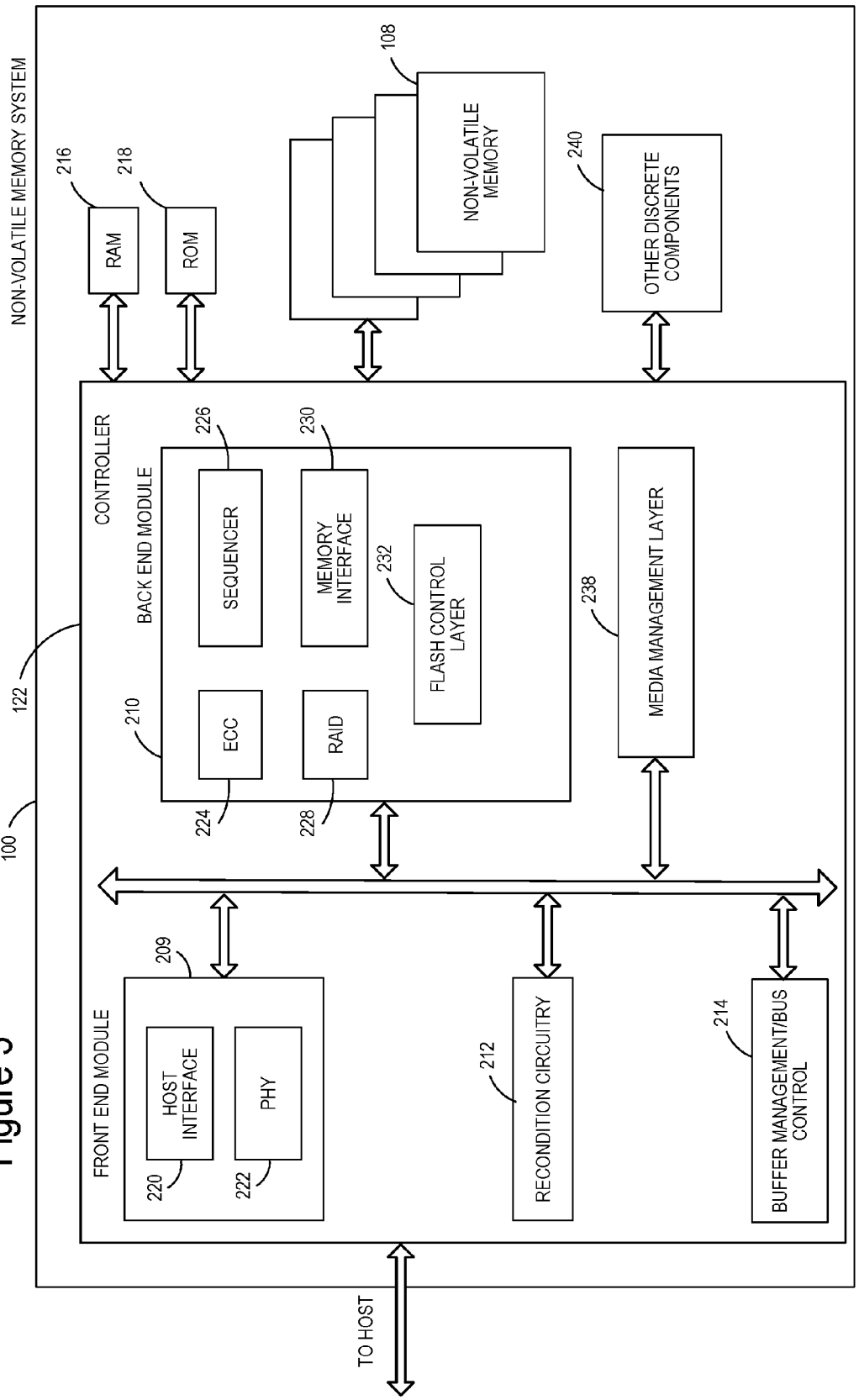
FIG. 3 is a block diagram of example memory system, depicting more details of Controller.

FIG. 3 is a block diagram of example memory system 100, depicting more details of Controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between Controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

In some embodiments, non-volatile memory system 100 includes a single channel between Controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 3, Controller 122 includes a front end module 209 that interfaces with a host, a back end module 210 that interfaces with the one or more non-volatile memory die 108, and various other modules that perform functions which will now be described in detail.

The components of Controller 122 depicted in FIG. 3 may take the form of a packaged functional hardware unit (e.g., an electrical circuit) designed for use with other components, a portion of a program code (e.g., software or firmware) executable by a (micro)processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for Controller 122 to perform the functions described herein. The architecture depicted in FIG. 3 is one example implementation that may (or may not) use the components of Controller 122 depicted in FIG. 2 (i.e. RAM, ROM, processor, interface).

Referring again to modules of the Controller 122, a buffer manager/bus controller 214 manages buffers in random access memory (RAM) 216 and controls the internal bus arbitration of Controller 122. A read only memory (ROM) 218 stores system boot code. Although illustrated in FIG. 3 as located separately from the Controller 122, in other embodiments one or both of the RAM 216 and ROM 218 may be located within the controller. In yet other embodiments, portions of RAM and ROM may be located both within the Controller 122 and outside the controller. Further, in some implementations, the Controller 122, RAM 216, and ROM 218 may be located on separate semiconductor die.

Front end module 209 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, Controller 122 and multiple memory dies (together comprising non-volatile storage system 100) implement a solid state drive (SSD), which can emulate, replace or be used instead of a hard disk drive inside a host, as a NAS device, etc. Additionally, the SSD need not be made to work as a hard drive.

Figure 4A:
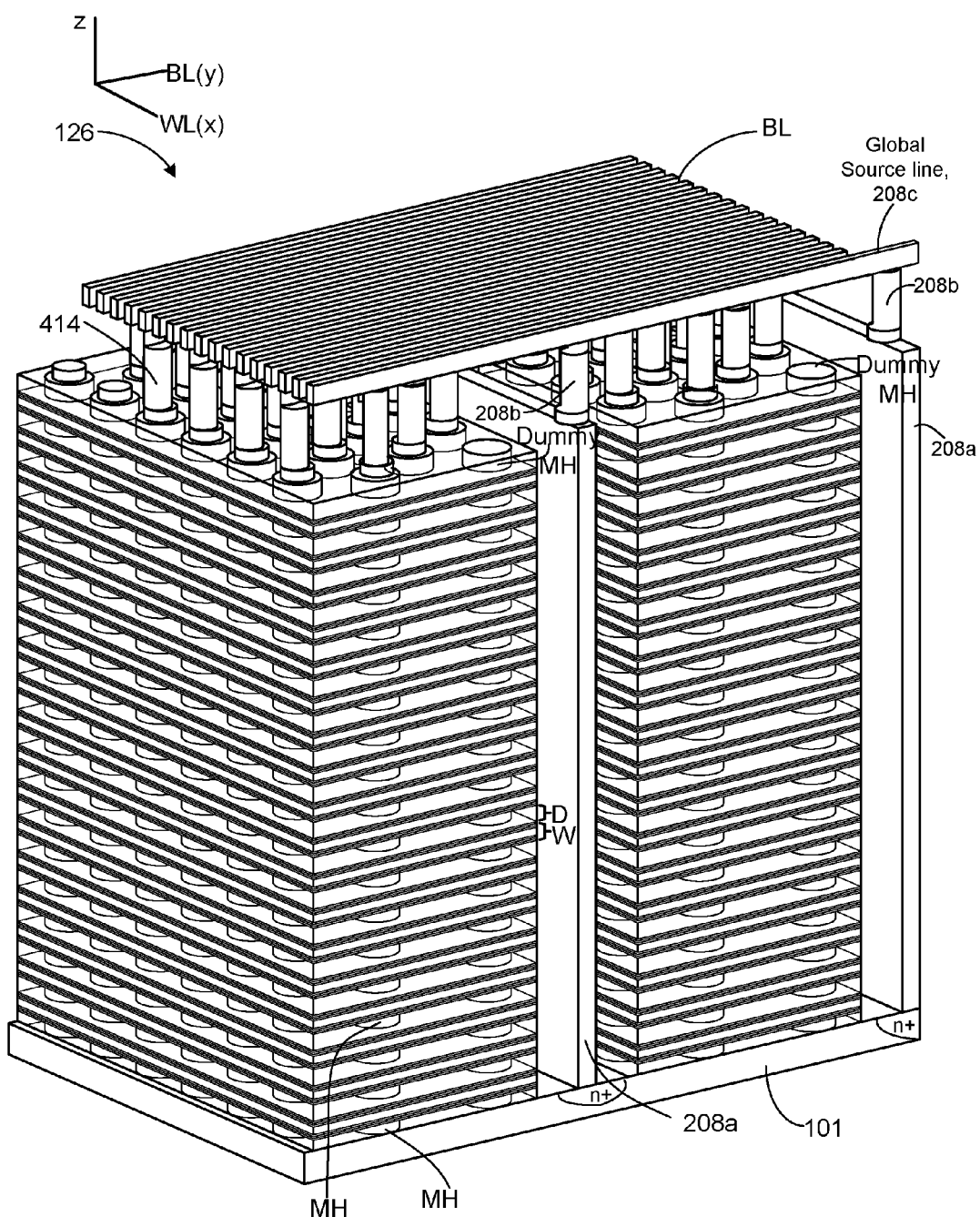
FIG. 4A is a perspective view of a portion of a three dimensional monolithic memory structure, which includes a plurality memory cells.

FIG. 4A is a perspective view of a portion of a three dimensional monolithic memory structure 126, which includes a plurality memory cells. For example, FIG. 4A shows a portion of one block of memory. The structure depicted includes a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or fewer than 108-216 layers can also be used. The alternating dielectric layers and conductive layers are divided into "fingers" by local source lines 208a. Note that the local source lines 208a may also be referred to as local interconnects LI. FIG. 4A only shows two fingers and two local interconnects LI. The local source lines 208a are conductive elements. Below the alternating dielectric layers and word line layers is a substrate 101. Each local source line 208a is in electrical contact with an n+ diffusion region of the substrate 101.

Memory holes are formed in the stack of alternating dielectric layers and conductive layers. For example, one of the memory holes is marked as MH. Note that in FIG. 4A, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. Two of the memory holes, which are not used for data storage, are labeled as dummies (Dummy MH).

A number of bit lines (BL) are depicted over the top of the structure 126. Each bit line is connected to one of the memory holes (other than the Dummy MH) by a bit line contact 414. A global source line 208c is depicted over the structure 126, running parallel to the bit lines. The global source line 208c may extend over multiple blocks in a plane. The global source line 208c is in direct electrical contact with source line contact 208b, which is in direct electrical contact with the local source line 208a. By providing a voltage to the global source line 208c, the local source lines 208a may provide a voltage to the substrate 101. The voltage from the substrate 101 may be provided to the memory cells under control of a source side select line (SGS). In this manner, the local source lines 208a may provide operational voltages to memory cells. Note that the block select line is not depicted in FIG. 4A, so as to not obscure other features. Also note that the global source line 208c may or may not have the same width (referring to the x-direction) as the bit lines. In one embodiment, the global source line 208c is wider than the bit lines (in the x-direction). Also, the global source line 208c is not required to be in the same metal layer as the bit lines.

Figure 4B:
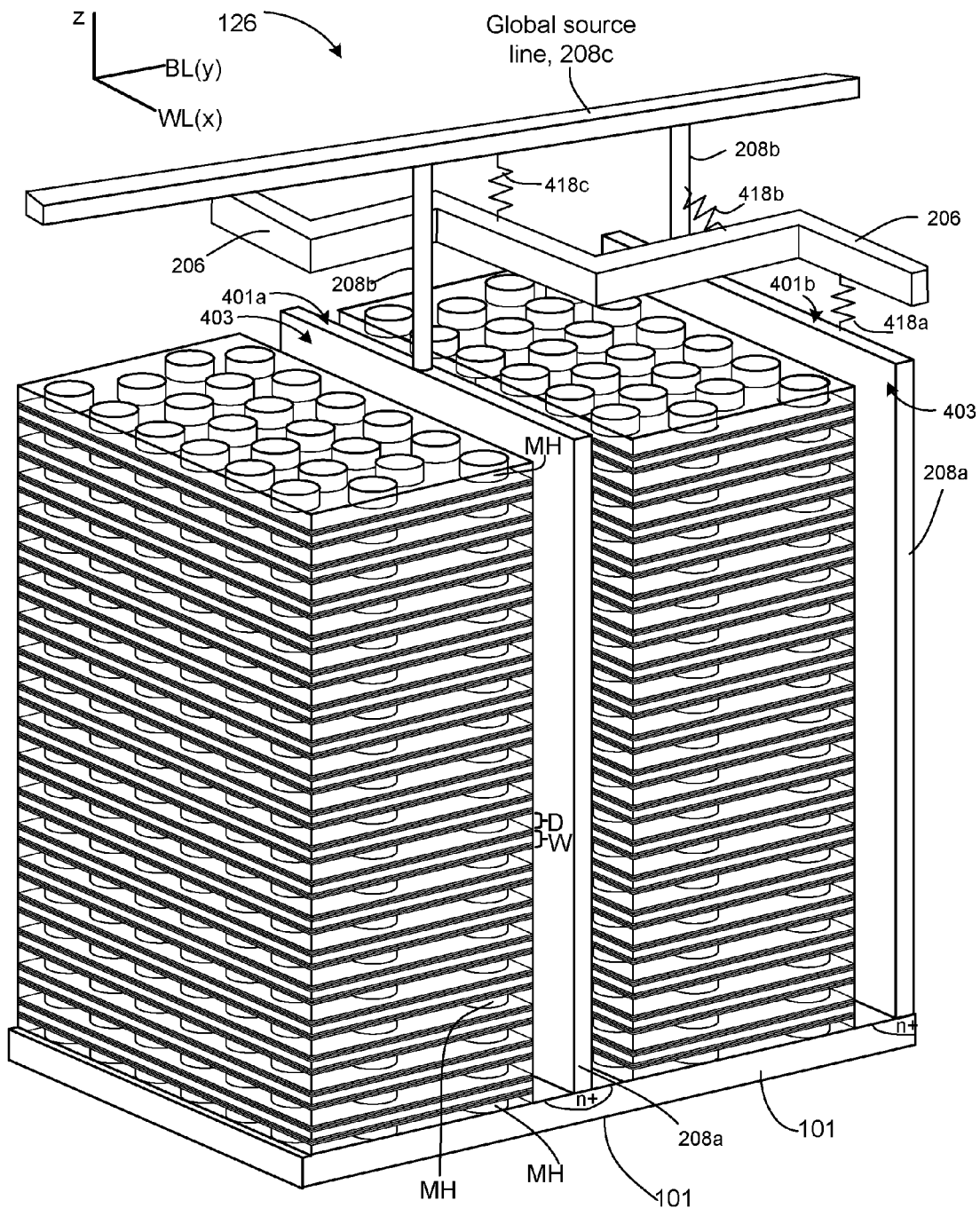
FIG. 4B is a perspective view of a portion of a three dimensional monolithic memory structure, showing one embodiment of a block select line.

FIG. 4B is a perspective view of a portion of a three dimensional monolithic memory structure 126, similar to the one of FIG. 4A. However, FIG. 4B depicts a block select line 206, but omits the bit lines. The block select line 206 extends over top of the stack of alternating dielectric layers and conductive layers. The block select line 206 runs in close physical proximity to the local source lines 208a. The block select line 206 also runs in close physical proximity to the source line contacts 208b. Additionally, the block select line 206 may run in close physical proximity to a portion of the global source line 208c. Therefore, the potential exists for an electrical short 418a to form between the block select line 206 and either of the local source lines 208a. Likewise, the potential exists for an electrical short 418b to form between the block select line 206 and either of the source line contacts 208b. Also, the potential exists for an electrical short 418c to form between the block select line 206 and the global source line 208c.

Since the local source lines 208a, source line contacts 208b, and global source line 208c form one contiguous electrically conductive region, an electrical short between a block select line 206 and any point in the contiguous electrically conductive region 208 may impact the voltage on any local source lines 208a. Also note that there may be more than one global source line 208c in electrical contact with a single local source line 208a.

In the example of FIG. 4B, the block select line 206 has a first portion that extends over a top minor side 401a of one of the local source lines 208a and a second portion that extends over a top minor side 401b the other one of the local source lines 208a. The first and second portions extend in the word line direction (e.g., x-direction). The block select line 206 also has a third portion that electrically connects the first portion and the second portion. A reason for this shape is for the block select line 206 to avoid the source line contacts 208b that connect to the top minor sides 401. The third portion itself has three separate sections including a first section that extends in the bit line direction, which is connected to a second section that extends in the word line direction, which is connected to a third section that extends in the bit line direction. The first section is connected to the first portion of the block select line 206, and the third section is connected to the second portion of the block select line.

Also note that in this example, the local source lines 208a each have a major side 403 that extends in the x-y plane. The major side 403 extends vertically upwards from the substrate 101. Note that only one major side 403 of each local source line 208a is labeled. However, there is a second major side parallel to the labeled major side 403.

Figure 4C:
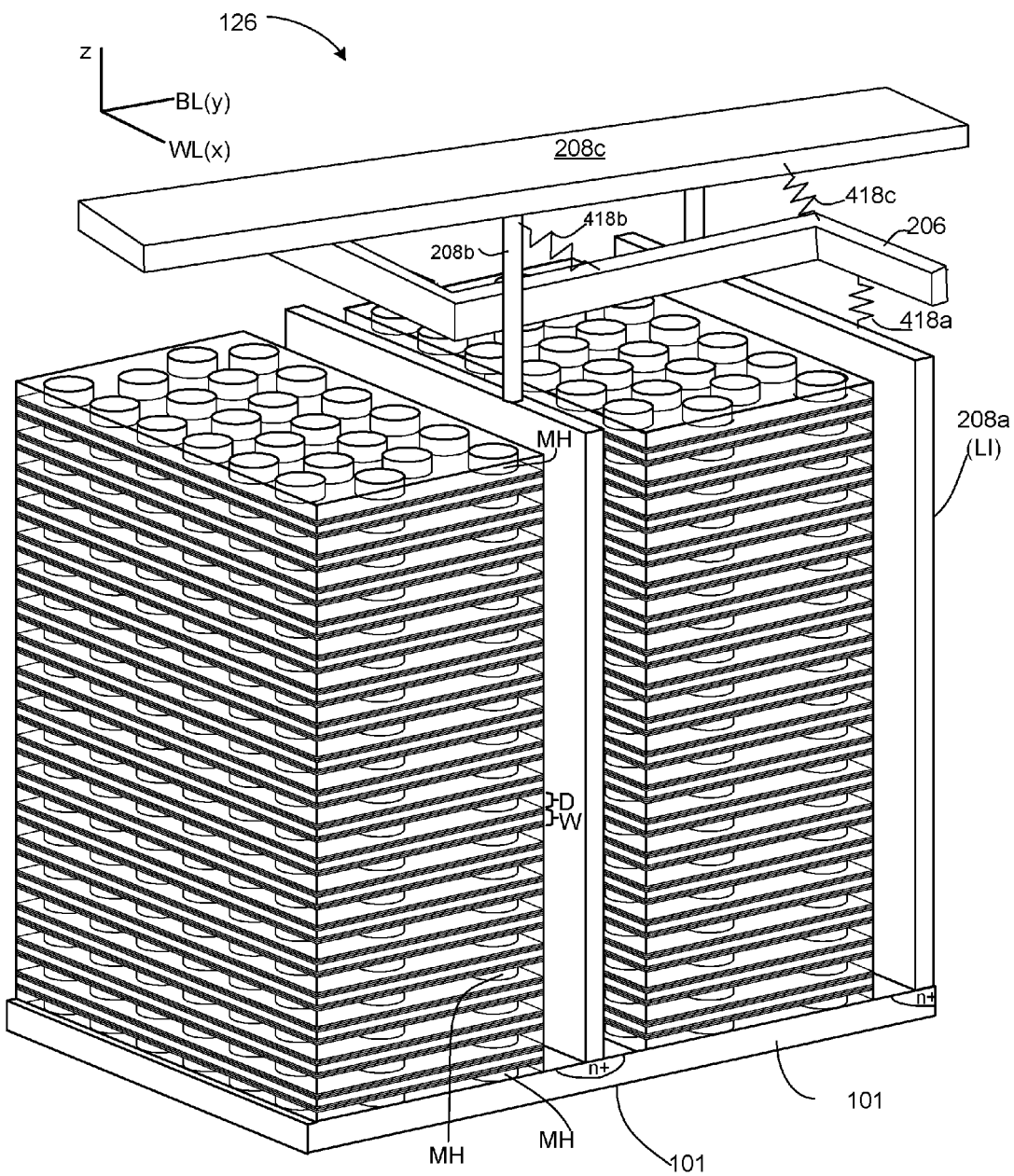
FIG. 4C is a perspective view of a portion of a three dimensional monolithic memory structure, showing another embodiment of a block select line.

FIG. 4C shows another shape for the block select line 206. As with the example of FIG. 4B, the block select line 206 has a first portion that extends over a top minor side of one of the local source lines 208a and a second portion that extends over a top minor side of the other one of the local source lines 208a. The first and second portions extend in the word line direction (e.g., x-direction). The block select line 206 also has a third portion that electrically connects the first portion and the second portion. A reason for this shape is for the block select line 206 to avoid the source line contacts 208b. In this example, the third portion extends only in the bit line direction (e.g., has just one section). The source line contacts 208b may be "staggered" in this embodiment so that the block select line 206 can avoid the source line contacts 208b. By "staggered" in this context it is meant that an imaginary line between the two source line contacts 208b in FIG. 4C does not run parallel to the bit line direction.

FIG. 4D shows electrical connections between of one embodiment the NAND strings and a bit line 411 and a local source line 208a. A single column 406 is depicted. The column 406 has charge storage region 497, tunnel dielectric 498, semiconductor channel 499, and core 495. On one side of the column 406, SGS, several word lines (WL0, WL1, WL2, WL3, . . . WLn), and SGD are depicted. Also, a blocking layer 496 is associated with each of SGS, WL0, WL1, WL2, WL3, . . . WLn, and SGD. Note that the word lines and blocking layer may completely surround the column 406. However, this is not depicted in FIG. 4D so as to not obscure the diagram. Also, the dielectric layers shown in FIGS. 4A-4C that alternate with the word line layers are not depicted in FIG. 4D.

The bit line contact 413 is formed from metal, in one embodiment. Likewise, bit line 411 is formed from metal, in one embodiment. Example metals for the bit line and bit line contact include, but are not limited to, titanium, tungsten, copper, aluminum, and molybdenum.

FIG. 4D also depicts a source side select transistor. The SGS, which may be formed from metal, serves as the control gate of the source side select transistor, in one embodiment. The portion of the blocking layer 496 that is between SGS and the body 402 serves as a gate dielectric of the source side select transistor. The body 402 of the source side select transistor is formed from crystalline silicon, in one embodiment. The source side select transistor body 402 is in direct physical contact with the substrate 101, which may be formed from silicon. The portion of the substrate that is adjacent to the body 402 may be p-type. The channel 412 of the source side select transistor has a vertical component in the column 406 and a horizontal component in the substrate 101. A gate oxide 416 is depicted on the surface of the substrate 101. This may serve as a portion of the gate oxide of the source side select transistor.

Source 490 may act as the source of the source side select transistor. The source 490 may be an n+ region. Thus, source 490 can be formed by heavily doping the silicon substrate 101. The n-type impurity can be phosphorous (P), arsenic (As) or a combination of both, for example.

The local source line 208a is in electrical contact with the source 490 of the source side select transistor. The local source line 208a is formed from metal, in one embodiment. Example metals include, but are not limited to, titanium, tungsten, copper, aluminum, and molybdenum. The local source line 208a can be electrically connected to the NAND string channel 499 by the action of the source side select transistor, when a respective bias is applied to the SGS line. Note that the local source line 208a may serve as a common source line for a number of NAND strings.

Figure 5A:
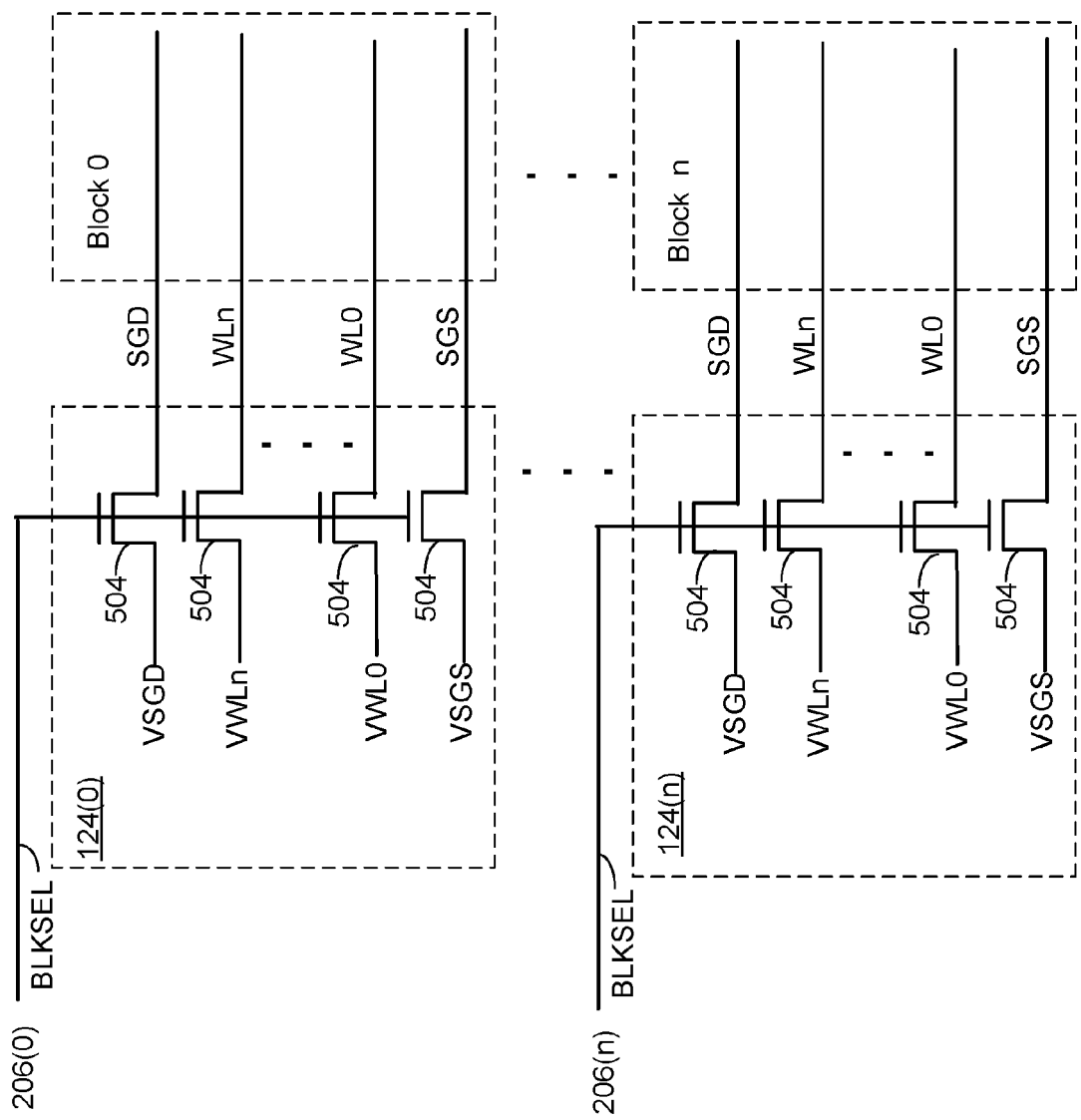
FIG. 5A is a diagram showing further details of one embodiment of transistors in row decoders.

FIG. 5A is a diagram showing further details of one embodiment of transistors in row decoders 124. The diagram shows row decoders 124(0) and 124(n), consistent with those in FIG. 2. The row decoders 124 for blocks not depicted in FIG. 5A may be similar to those depicted. Each row decoder 124 has a number of pass transistors 504. Each pass transistor 504 is connected to either a word line (WL0 . . . WLn), SGS, or SGS, in this example. Each pass transistor 504 has a terminal to which a voltage to be passed to the block is provided. For example, a drain side select line voltage (VSGD) is provided to one terminal of the pass transistor 504 that is connected to the drain side select line (SGD). Word line voltages (VWL0 . . . VWLn) are provided to one terminal of the pass transistors 504 that are connected to the respective word lines (WL0 . . . WLn). A source side select line voltage (VSGD) is provided to one terminal of the pass transistor 504 that is connected to the source side select line (SGS).

Block select line 206(0) is connected to the control terminals (e.g., gate terminal) of all of the pass transistors 504 in row decoder 124(0). Block select line 206(n) is connected to the control terminals of all of the pass transistors 504 in row decoder 124(n). Each of these lines 206(0), 206(n) is labeled as "BLKSEL". Herein, BLKSEL refers to a block select line that is connected to a control terminal of a pass transistor 504 in a row decoder 124. The voltage that is needed to turn on a pass transistor 504 in order to pass the voltages needs to be at least as high as the voltages to be passed, in one embodiment. In some cases, the voltages to be passed may be quite high. For example, during programming word line voltages could be 20V, as one example. At the same time, the voltage on the common source line (not depicted in FIG. 5A) could be quite low (at or near ground). Hence, there may be a substantial difference between these two voltages. Such a voltage difference can potentially result in breakdown of the dielectric material between the block select line 206 and source line 208 and/or trapping of charges in the dielectric material.

Figure 5B:
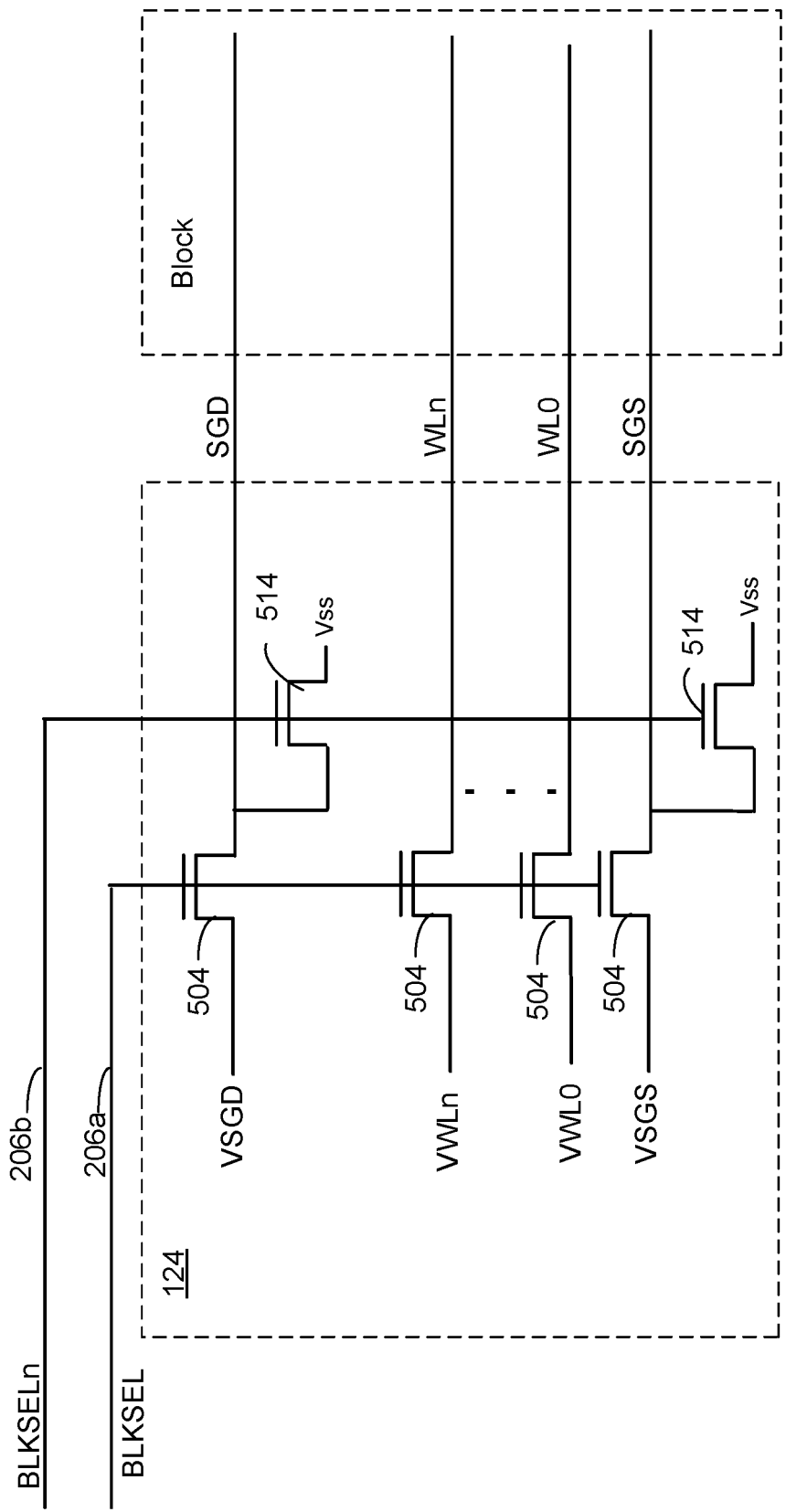
FIG. 5B depicts another embodiment of a row decoder in which there is a BLKSELn line in addition to a BLKSEL line.

Note that in the examples of FIGS. 2 and 5A, a single block select line is depicted for each row decoder. In some embodiments, more than one block select line can be used per row decoder. These two block select lines may be referred to a BLKSEL and BLKSELn. FIG. 5B depicts another embodiment of a row decoder 124 in which there is a BLKSELn line 206b in addition to a BLKSEL line 206a. The BLKSELn line 206b is connected to grounding transistors 514 in the row decoder 124. One terminal of grounding transistors 514 may be provided with a low voltage (labelled as Vss, which could be ground). The grounding transistors 514 may be used to ground at least some of the pass transistors 504 when a block is not selected. In this embodiment, there is a grounding transistor 514 connected to the pass transistors 504 for SGD and SGS. In one embodiment, when a block is selected the signal BLKSELn is 0V. However, when a block is not selected the signal BLKSELn may be about 2.2V. This may serve to ground pass transistors 504 connected to SGD and SGS in selected blocks.

In some embodiments, the BLKSELn lines 206b also run over the top of the memory array (in addition to the BLKSEL lines 206a). Hence, it is possible for there to be an electrical short between a BLKSELn line 206b and a source line 208. A short between a BLKSELn line 206b and a source line 208 could also lead to plane level failures. One possible reason is as follows. The voltage on a BLKSELn line 206b to an unselected block may be about 2.2V. This voltage could be different than the voltage applied to the source line 208 for various operations. As one example, for erase the source line 208 may be raised to a high voltage. However, a short between a BLKSELn line 206b at, for example, 2.2V could prevent the source line 208 from charging up to a sufficient voltage to erase the memory cells in the selected block. As discussed above, all of the blocks in the plane could suffer from this erase failure (with the exception of the block having the BLKSELn line 206b that is shorted to the source line 208, which could suffer a different type of failure).

There could also be plane level failures for other types of memory operations due to a BLKSELn line 206b to source line 208 electrical short. For example, during a read operations the system could apply a voltage less than 2.2V to the source line 208. Hence, this voltage to the source line 208 may be uncertain due to the short, thereby potentially making read operations inaccurate.

Figure 6:
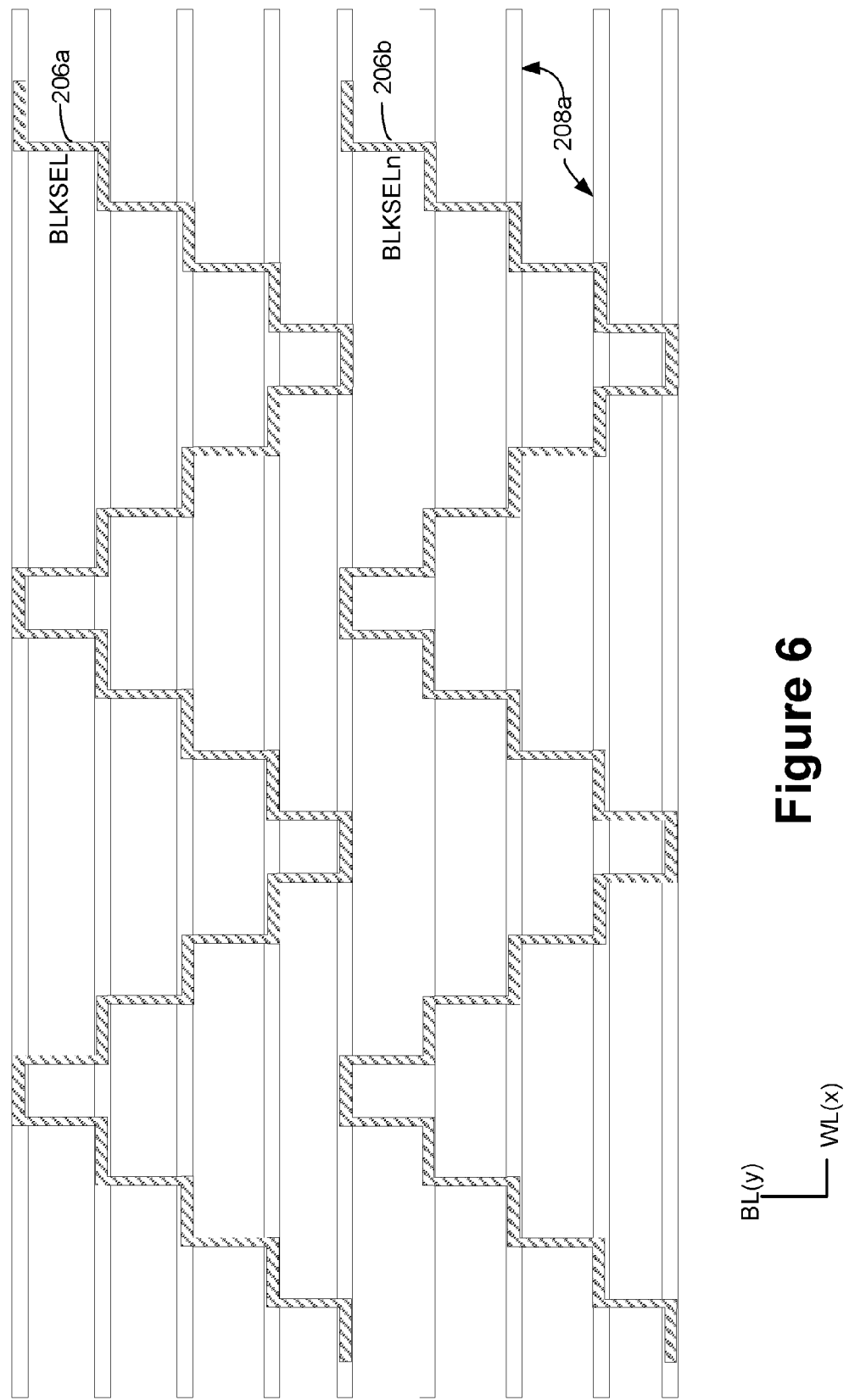
FIG. 6 is a top view showing how a BLKSEL line and a BLKSELn line extend across source lines, in one embodiment.

FIG. 6 is a top view showing how a BLKSEL line 206a and a BLKSELn line 206n extend across local source lines 208a, in one embodiment. Only a few of the local source lines 208a are labeled. The local source lines 208a extend in the x-direction (WL direction). The BLKSEL line 206a and the BLKSELn line 206n may "snake" across the local source lines 208a. A reason for the snaking is to avoid source line contacts. For example, BLKSEL line 206a and a BLKSELn line 206n may snake to avoid source line contacts 208b (not depicted in FIG. 6). FIGS. 4B and 4C depict example of how the block select line 206 may be snaked to avoid source line contacts 208b.

Referring again to FIG. 6, each BLKSEL line 206a and a BLKSELn line 206n has portions that extend in the x-direction (WL-direction) and portions that extend in the y-direction (BL-direction). The portions that extend in the BL-direction may be referred to herein as "shunts". The portions that extend in the WL-direction may be referred to herein as "main" portions. Although the relative lengths of the main portions and shunts is depicted in FIG. 6 as about the same, this is not required to be the case. For example, the main portions could be significantly longer than the shunts.

Figure 7A:
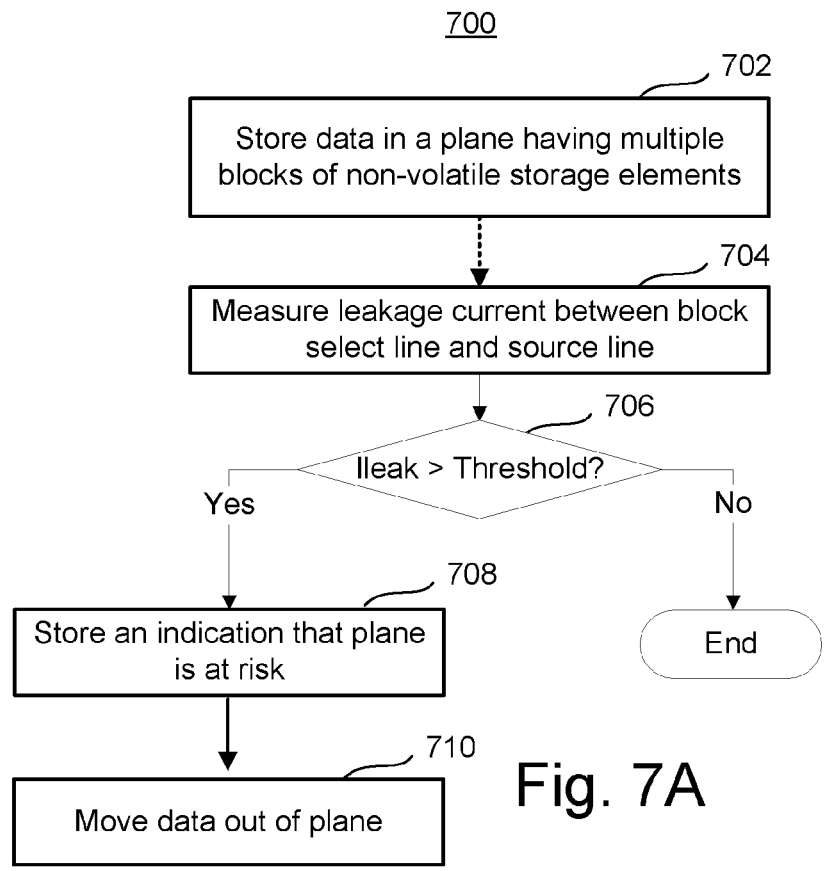
FIG. 7A is a flowchart of one embodiment of a process of operating non-volatile storage.

FIG. 7A is a flowchart of one embodiment of a process 700 of operating non-volatile storage. Process 700 may be performed by any combination of control circuitry 110, state machine 112, decoders 114/124a/124b/132, leakage current detection 115, power control module 116, sense blocks 150, read/write circuits 128, and Controller 122. Process 700 may be performed separately for each plane. Step 702 includes storing data in non-volatile storage elements in a plane having multiple blocks of non-volatile storage elements. This data could have been sent by host 140 for storage in the memory array 126.

The line between step 702 and 704 is dashed to indicate that considerable time may pass between these steps. Step 704 does not need to be performed each time that data is stored in the plane. In one embodiment, step 704 is performed every "x" program/erase cycles in the plane. Here, "x" may be selected to be infrequent enough to avoid impacting performance, but often enough to be able to catch the development of an electrical short between a block select line and a source line prior to a plane failure.

Step 704 includes measuring a leakage current between a block select line 206 and a source line 208. The block select line 206 is a line that is used to provide a voltage to control terminals of pass transistors in a row decoder 124, in one embodiment. For example, the block select line 206 under test may be BLKSEL 206a (see FIGS. 5A-5B). Optionally, BLKSEL 206b lines that provide voltages to grounding transistors in row decoders 124 may also be tested in a separate leakage current detection process.

The source line 208 is a contiguous electrically conductive region that is shared by at least one memory cell in multiple blocks in plane, in one embodiment. The source line 208 may be confined to a single plane. The source line 208 is a contiguous electrically conductive region made up of one or more global source lines 208c, one or more local source lines 208a, and one or more source line contacts 208b, in one embodiment. The source line 208 thus includes local source lines 208a in multiple blocks in the plane, in one embodiment. The leakage current measures a current that flows through an electrical isolation region between the block select line 206 and a source line 208, in one embodiment. The leakage current could be between the block select line 206 and a local source line 208a, between the block select line 206 and a source line contact 208b, or between the block select line 206 and a global source line 208c, as several examples.

Step 706 includes a determination of whether the leakage current (LEAK) is greater than a threshold (e.g., greater than a threshold current). This threshold is established as a level that is below a level that will cause a plane level failure, in one embodiment. The threshold is also established as a level that is high enough to indicate that the plane is susceptible to a plane level failure, in one embodiment.

If the leakage current is below the threshold, the process 700 may conclude.

If the leakage current is above the threshold, steps 708-710 may be performed. Step 708 includes storing an indication that the plane is at risk of a plane level failure. This step may include storing information in the effected plane, in a different part of the memory die having the effected plane, or external to the memory die having the effected plane. For example, the indication could be stored in non-volatile storage elements (on any die of the memory device), code/parameters 113, RAM 122b. Step 708 may include the memory die having the impacted plane reporting this to the controller 122. The controller 122 may, optionally, report the at risk plane to the host 140.

Step 710 includes moving data out of the plane. Step 710 therefore is able to prevent data loss. Step 710 is initiated by controller 122, in one embodiment.

Figure 7B:
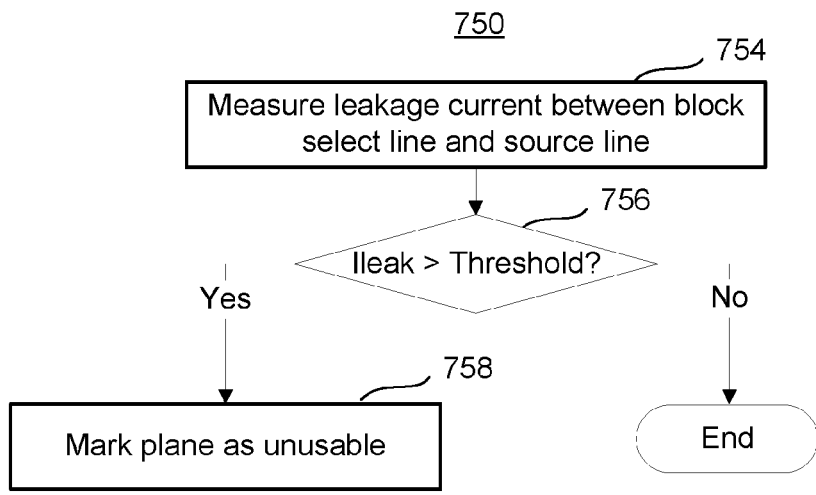
FIG. 7B is a flowchart of one embodiment of a process of determining whether any planes of a 3D memory device are unusable.

Process 700 may be performed "in the field." In one embodiment, leakage current detection is performed when testing the device after manufacture. FIG. 7B is a flowchart of one embodiment of a process 750 of determining whether any planes of a 3D memory device are unusable. Process 750 may be performed when testing the device after manufacture. Process 750 may be performed by any combination of control circuitry 110, state machine 112, decoders 114/124a/124b/132, leakage current detection 115, power control module 116, sense blocks 150, read/write circuits 128, and Controller 122. Thus, process 750 may be performed by circuitry that resides on the memory device. In one embodiment, process 750 is performed at package level testing. In one embodiment, process 750 is performed at system level testing. Process 750 is performed for each block select line that runs over top of a 3D memory array, in one embodiment. Process 750 may be performed separately for each plane.

Step 754 includes measuring a leakage current between a block select line 206 and a source line 208. The block select line 206 under test is a line that is used to provide a voltage to control terminals of pass transistors in a row decoder 124, in one embodiment. For example, the block select line 206 under test may be BLKSEL 206a (see FIGS. 5A-5B). Optionally, BLKSEL 206b lines that provide voltages to grounding transistors in row decoders 124 may also be tested in a separate leakage current detection process.

Source line 208 is a contiguous electrically conductive region made up of one or more global source lines 208c, one or more local source lines 208a, and one or more source line contacts 208b, in one embodiment. Step 754 may be similar to step 704 of process 700.

Step 756 includes a determination of whether the leakage current is greater than a threshold current. In one embodiment, the threshold current in step 756 is established as a level that is below a level that will cause a plane level failure but is high enough to indicate that the plane is susceptible to a plane level failure, in one embodiment. The threshold current in step 756 is not necessarily the same magnitude as step 706 of process 700.

If the leakage current is below the threshold current, the process 750 may conclude.

If the leakage current is above the threshold current, step 758 may be performed. Step 758 includes storing an indication that the plane is unusable. This could be stored, for example, in ROM 122a, RAM 122b, etc.

The memory device may have been manufactured with one or more spare planes. In this event, one of the spare planes can be used instead. The controller 122 might handle a remapping of the unusable plane to the spare plane during operation in the field. For some memory devices, it may be possible to operate with less than all of the planes. For example, a memory device that was manufactured with four planes might be re-purposed as a two plane memory device. One option is to disable the memory die containing the unusable plane. The memory device could have a spare die to replace the disabled die. Alternatively, the device might be operated with one fewer die, at least under some circumstances.

Process 700 may be modified to test for a leakage current between a block select line and a conduction region other than a source line. Process 750 may also be modified to test for a leakage current between a block select line and a conduction region other than a source line.

Figure 8:
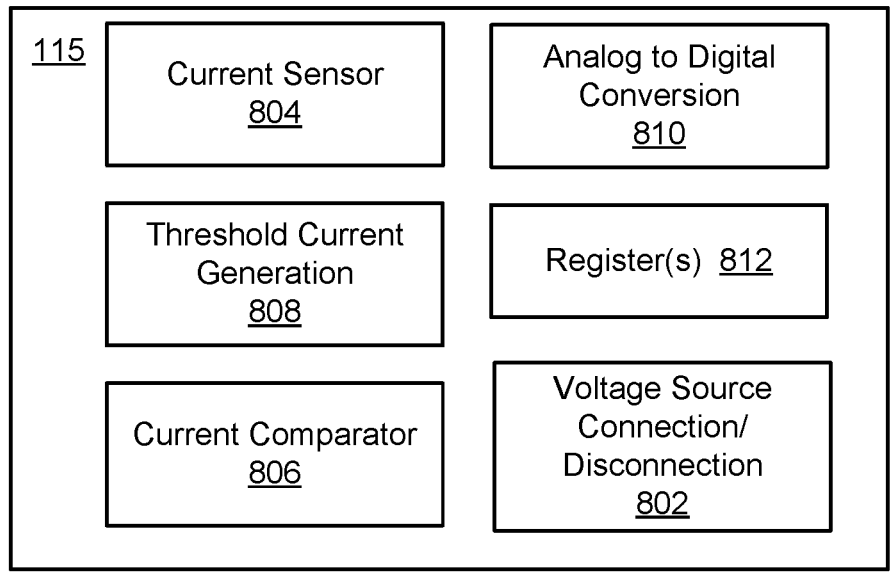
FIG. 8 is a block diagram of one embodiment of a leakage current detector.

FIG. 8 is a block diagram of one embodiment of a leakage current detector 115. The leakage current detector 115 includes voltage source connection/disconnection 802, current sensor 804, current comparator 806, threshold current generation 808, analog to digital conversion 810, and register(s) 812. The leakage current detector 115 may operate in response to signals from state machine 112 and/or controller 122.

The leakage current detector 115 may work in conjunction with one or more charge pumps that provide voltages. The charge pump(s) may be a part of power control 116. The charge pump(s) may be used to provide voltages (e.g., high voltages). The voltage source connection/disconnection may be used to connect/disconnect a charge pump to/from a conductive line (e.g., global source line, block select line) being tested. The voltage source connection/disconnection may be used to connect/disconnect a voltage from a voltage source that is not a charge pump to/from a conductive line. Voltage source connection/disconnection 802 is implemented with one or more transistors, in one embodiment. These transistors may be controlled by state machine 112, in one embodiment.

Current sensor 804 senses a current to/from a conductor to which the leakage current detector 115 is connected. Current sensor 804 may sense a current to/from the conductive region 208 or the block select line 206. In one embodiment, the leakage current detector 115 is configured to sink a current when sensing a leakage current. For example, when the leakage current detector 115 is connected to a source line 208, the leakage current detector 115 may sink a current from the source line. When the leakage current detector 115 is connected to a block select line 206, the leakage current detector 115 may source a current to the block select line. The foregoing may assume that the source line 208 is biased to a lower voltage than the block select line 206, during leakage current testing. Alternatively, the source line 208 may be biased to a higher voltage than the block select line 206, during leakage current testing. Current sensor 804 may be implemented using a combination of elements including, but not limited to, transistors, capacitors, and operational amplifiers.

Current sensor 804 may also be used to detect a reference current based on conditions when the leakage current detector 115 is not connected to either the source line 208 or block select line 206. When measuring the reference current, the source line 208 and block select line 206 are floating, in one embodiment. Current comparator 806 compares the reference current with a current sensed in response to applying voltages to the conductive region 208 and block select line 206, in one embodiment.

Analog to digital conversion (A/D) 810 is configured to convert an analog current sensed by the current sensor 804 to a digital value. Register(s) 812 may be used to store the digital values of the currents that are sensed by the current sensor 804.

Threshold current generation 808 generates the threshold current referred to in one embodiment of step 706 of FIG. 7A (or step 756 of FIG. 7B). Further details are discussed below.

Figure 9A:
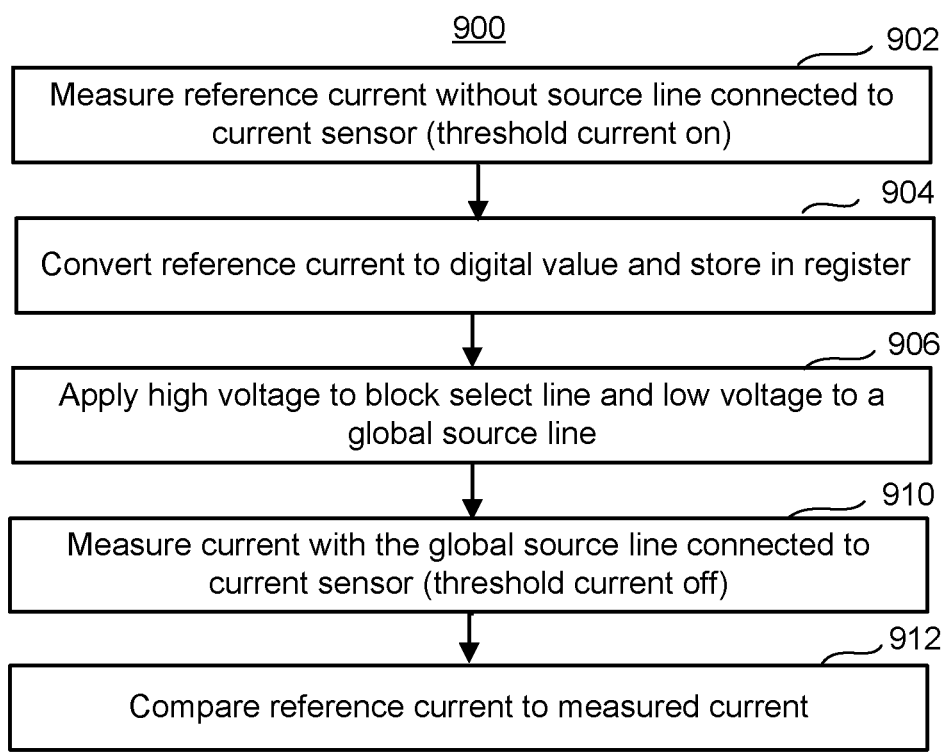
FIG. 9A is a flowchart of one embodiment of a process of measuring a leakage current.

Operation of the leakage current detector 115 will be discussed with respect to the flowchart of FIG. 9A. FIG. 9A is a flowchart of one embodiment of a process 900 of measuring a leakage current. Process 900 is one embodiment of step 704 of process 700. Process 900 is one embodiment of step 754 of process 750. In process 900, the leakage current detector 115 senses a current from the source line 208.

In step 902, a reference current is measured without the current sensor 804 of the leakage current detector 115 connected to the source line 208. In one embodiment, the source line 208 and all of the block select lines 206 in the plane under test are floating when the current sensor 804 in the leakage current detector 115 measures the reference current. This reference current may be due, in part, to currents within the leakage current detector 115. In one embodiment, the reference current comprise a common mode current ($I_{CM}$), a threshold current ($I_{DT}$), and a background current ($I_{BG}$). The common mode current is due to a common mode current generator in the leakage current detector 115, in one embodiment. The background current may be due to a background currents.

The threshold current ($I_{DT}$) is generated by threshold current generation 808 in the leakage current detector 115, in one embodiment. The threshold current may be set a threshold current referred to in step 706 of process 700 (or, alternatively, step 756 from process 750). The threshold current may be used to assure that there needs to be a certain minimum current for the leakage current to be considered significant. Note that there could be more than one threshold current generator, which each establish different threshold currents. These threshold current generators can be run during different leakage current measurements in order to allow the leakage current to be compared with different thresholds. Equation 1 describes the reference current ($I_{REF}$) for one embodiment.

$$I_{REF}=I_{CM}+I_{DT}+I_{BG} \qquad (1)$$

In step 904, the A/D conversion 810 converts the (analog) reference current to a digital value, such that the digital value can be stored in a register 812. Step 904 is optional.

In step 906, a relatively high voltage is applied to a block select line 206 and a relatively low voltage is applied to the source line 208. In one embodiment, one or more global source line 208c has a low voltage applied thereto. In one embodiment, the low voltage that is applied to the global source line 208c is ground. Note that applying the low voltage to the global source line 208c may pass that voltage to multiple local source lines 208a in the plane under test. Note that step 906 may result in all of the local source lines 208a in the plane under test having the low voltage applied thereto.

In one embodiment, the voltage that is applied to the block select line 206 in step 906 is a voltage that may be used to select a block. For example, this may be a voltage applied to a control terminal of a pass transistor. In one embodiment, one block select line 206 in the plane under test is selected in step 906, with all other block select lines 206 unselected. Unselected block select lines 206 could be biased to a low voltage, such as the same voltage applied to the global source line 208c. Thus, note that process 900 may be used to test block select lines 206a that provide voltages to control terminals of pass transistors in row decoders. In one embodiment, the block select line 206 under test is a BLKSEL 206a line. Process 900 may be performed separately for all BLKSEL lines 206a that extend over top of the memory array, in one embodiment. Process 900 is only performed for BLKSEL lines 206a that are in close physical proximity to one or more local source lines 208a, in one embodiment.

In one embodiment, in order to distinguish shorts between the source line 208 and elements other than the block select line 206, those other elements are biased to the same voltage as the source line 208. Those other elements could include, but are not limited to, word lines (including dummy word lines), bit lines, and select gate lines (e.g., SGS, SGD).

An electrical short between the source line 208 and such other elements (e.g., word lines (including dummy word lines), and select gates (e.g., SGS, SGD) might only be a block level failure. Hence, being able to distinguish between the block select line 206 to source line 208 short and these other shorts may be important to determine whether there is a plane level failure (or risk of plane level failure).

In some embodiments, the voltages applied during step 906 are as in Table I. The "Block Select Voltage" may be a relatively high voltage that is applied to a control terminal of a pass transistor when selecting a block. For example, it may be a voltage that is suitable to pass voltages to the word lines and select lines. The following are just one example, other voltages could be used.

TABLE I

| Conductive Region | Voltage |
| --- | --- |
| BLKSEL (selected block) | Block Select Voltage |
| BLKSEL (unselected block) | 0 V |
| BLKSELn (selected block) | 0 V |
| BLKSELn (unselected block) | 2.2 V |
| Global Source lines | 0 V |
| VSGD | 0 V |
| Word Line Voltages | 0 V |
| VSGS | 0 V |
| Bit line Voltages | 0 V |

In step 910, the current sensor 804 in the leakage current detection 115 measures a current in response to the voltages applied to the block select line 206 and the source line 208. In step 910, the current sensor 804 may be connected to the source line 208 (e.g., to a global source line 208c). Step 910 may include sensing the current while the high voltage is applied to the block select line 206 and while the low voltage is applied to the global source line 208c. The threshold current (generated by threshold current generation 808) is not used in step 910, in one embodiment. Thus, threshold current generator 808 may be switched off (or otherwise disconnected), in step 910.

The current that is sensed in step 910 may thus include any potential leakage current ($I_{LEAK}$) between the block select line 206 and source line 208, the common mode current, and the background current. Equation 2 describes the current measured ($I_{MEAS}$) in step 910.

$$I_{MEAS} = I_{CM} + I_{LEAK} + I_{BG} \quad (2)$$

In step 912, the current comparator 806 compares the reference current $I_{REF}$ to the current measured $I_{MEAS}$ in step 910. Equation 3 summarizes this process.

$$[I_{CM} + I_{LEAK} + I_{BG}] - [I_{CM} + I_{DT} + I_{BG}] = I_{LEAK} - I_{DT} \quad (3)$$

The comparison thus compares the leakage current ($I_{LEAK}$) with the threshold current ($I_{DT}$). Note that this is the comparison referred to in either step 706 of process 700 or step 756 of process 750. In one embodiment, the stored digital value of the reference current (from step 904) is used in the comparison. The A/D convertor 810 may convert the current sensed in step 910 to a digital value and store it into the registers 812. Thus, in one embodiment, the current comparator 806 compares two digital values from the registers 812. Other techniques could be used to compare the reference currents with the current from step 910.

A variation of process 900 is to test more than one BLKSEL line at a time. In one embodiment, in step 904, a high voltage is applied to all BLKSEL lines 206a that run over the top of the 3D memory array. Step 904 could be performed with any subset of BLKSEL lines 206a that run over the top of the 3D memory array biased to a high voltage.

As noted, the block select line 206 under test in one embodiment of process 900 may be a BLKSEL 206a line, which provides a voltage to a control terminal of a pass transistor. Note that there may also be BLKSELn lines 206b that extend over top of the memory array. These BLKSELn lines 206b may optionally be tested for a short to the source line 208. In one embodiment, the voltages from Table I may be used to when testing BLKSELn lines 206b. However, the threshold current may be different than when testing a BLKSEL line 206a.

Figure 9B:
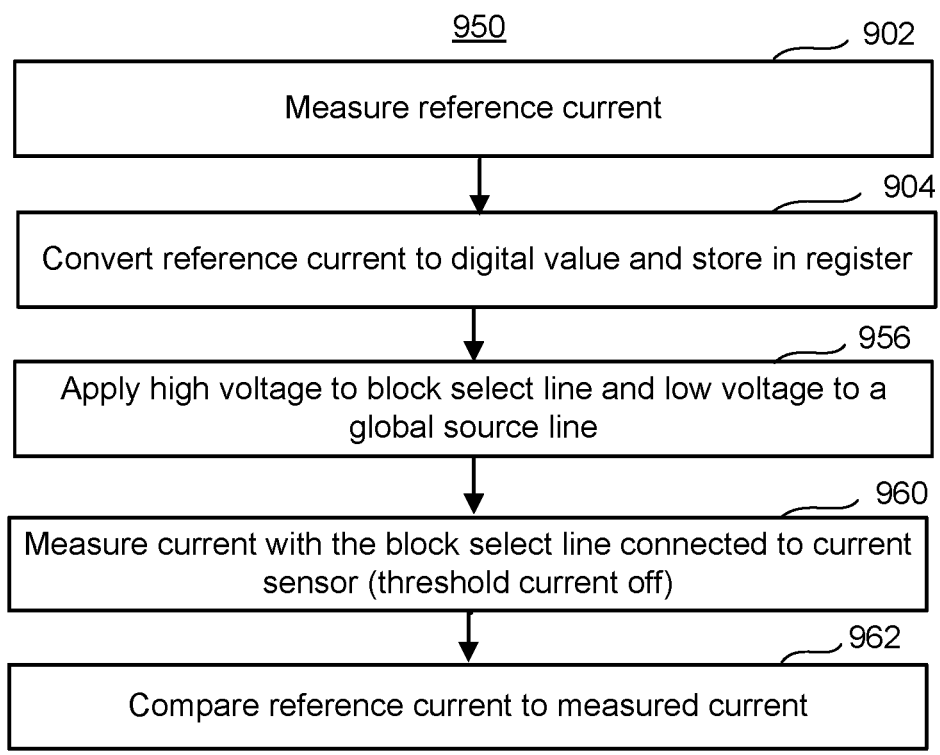
FIG. 9B is a flowchart of another embodiment of a process of measuring a leakage current.

FIG. 9B a flowchart of another embodiment of a process 950 of measuring a leakage current. Process 950 is one embodiment of step 704. In process 950, the leakage current detector 115 senses a current from a block select line 206. The process 950 begins in a similar manner as process 900 with measuring a reference current (step 902), converting the analog reference current to a digital value and storing it in a register (step 904), and applying a high voltage to the block select line 206 under test while applying a low voltage to the source line 208 (step 956). In one embodiment, the block select line 206 under test is a BLKSEL 206a line, which provides a voltage to a control terminal of a pass transistor.

In one embodiment, the voltage that is applied to the block select line 206 in step 956 is a voltage that may be used to select a block (e.g., a control voltage to a pass transistor in a row decoder 124 of a selected block). In one embodiment, one block select line 206 in the plane is selected in step 956, with all other block select lines 206 unselected. Unselected block select lines 206 could be biased to a low voltage, such as the same voltage applied to one or more global source lines 208c. In one embodiment, the low voltage applied to the one or more global source lines 208c is ground.

In some embodiments, the voltages applied during step 956 are as in Table II. The "Block Select Voltage" may be a relatively high voltage that is used to select a block. For example, it may be a voltage that is suitable to turn on pass transistors 504 to pass voltages to the word lines and select lines. The following are just one example, other voltages could be used.

TABLE II

| Conductive Region | Voltage |
| --- | --- |
| BLKSEL (selected block) | Block Select Voltage |
| BLKSEL (unselected block) | 0 V |
| BLKSELn (selected block) | 0 V |

TABLE II-continued

| Conductive Region | Voltage |
| --- | --- |
| BLKSELn (unselected block) | 2.2 V |
| Global Source lines | 0 V |
| VSGD | Block Select Voltage |
| Word Line Voltages | 0 V |
| VSGS | 0 V |
| Bit line Voltages | Block Select Voltage |

In step 960, the current sensor (which is connected to the block select line 206) senses a current. In one embodiment, the current sensor sources a current to the block select line 206. This current may flow from the block select line 206, through an electrical short, and into to the source line 208. The current may flow from the source line 208 to ground (assuming the source line 208 is grounded). As with step 910, the threshold current is not used in step 960.

In step 962, the reference current is compared to the measured current. As with step 912, step 962 may in effect compare the leakage current with a threshold current. Thus, step 962 may be used as one embodiment of either step 706 or 756.

As noted, the block select line 206 under test in one embodiment of process 950 may be a BLKSEL 206a line, which provides a voltage to a control terminal of a pass transistor. In one embodiment, the voltages from Table II may be used to when testing BLKSELn lines 206b for an electrical short to the source line 208. However, the threshold current may be different than when testing a BLKSEL line 206a.

Figure 10A:
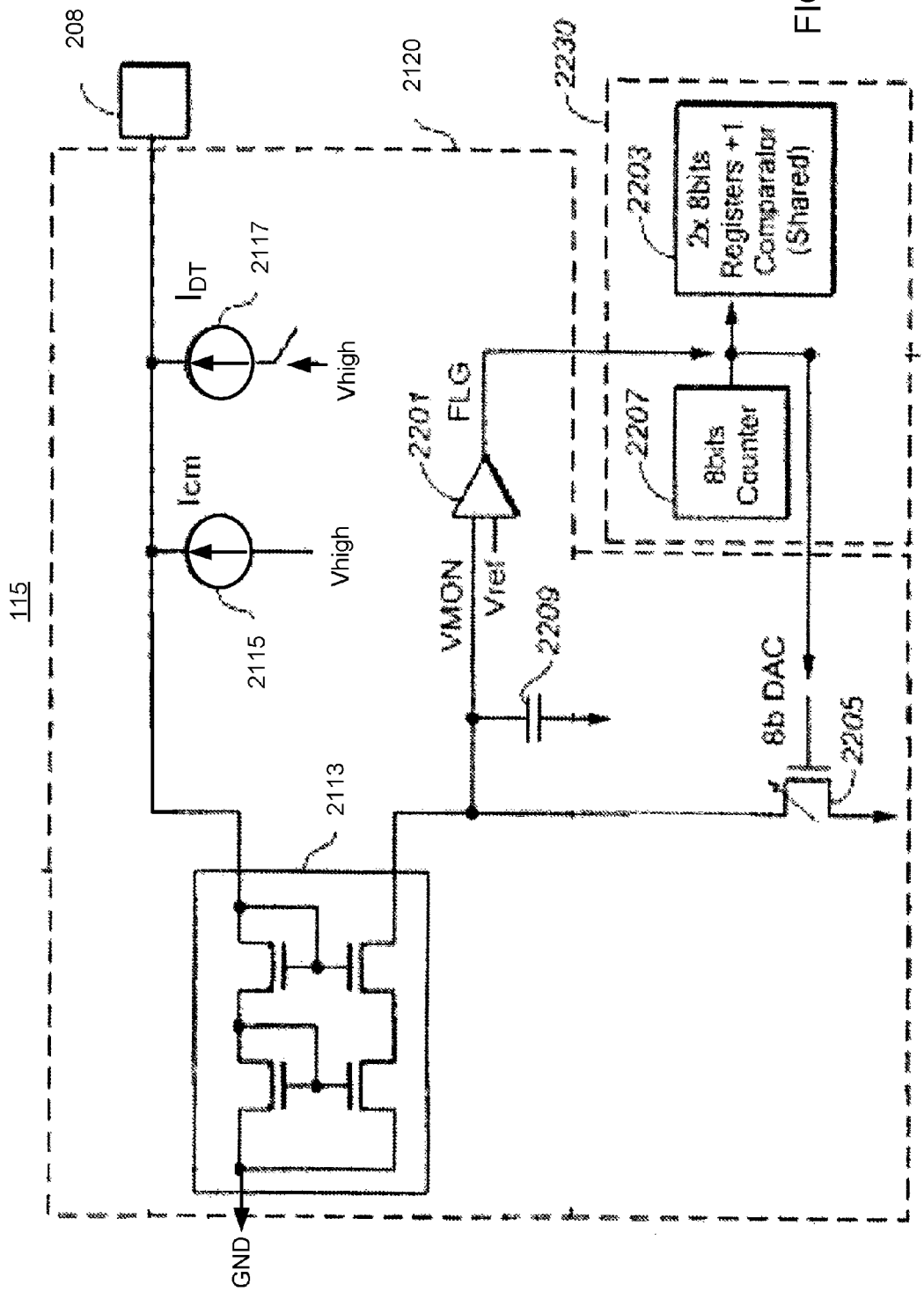
FIGS. 10A and 10B are circuit diagrams of embodiments of a leakage current detector.

FIG. 10A shows one embodiment of a leakage detection circuit 115. This is one embodiment of the leakage detection circuit of FIG. 8. In one embodiment, the leakage detection circuit 115 of FIG. 10A is used during the process of FIG. 9A. Leakage detection circuit 115 comprises block 2120 and block 2230. Circuitry 2113 is connected to ground (GND), which may serve as the testing voltage. Block 2220 provides GND to the common source line 208, in this embodiment. One or more intervening components may reside between component 2220 and the common source line 208 to provide GND to the common source line.

During testing, rather than use the actual current, and thereby dilute the measuring process, the current is mirrored by the current mirror 2113, here formed by two pairs of high voltage NMOSs. The mirrored current is then used to detect the leakage, whether the reference value or the actual leakage test value. Transistor 2205, comparator 2201 (here just represented as an inverter), counter 2207 and register 2203 are depicted. The comparator 2201 is shown to have as input a reference voltage Vref that could be supplied by, for example, a bandgap circuit. The capacitor 2209 smoothes out the VMON level. The counter/comparator 2203 may have a register (2 by 8-bits in this example) and a comparator.

Block 2220 also includes Icm 2115 as a common mode current source to set a minimum current flow through the current mirror to meet settling/detection time. The threshold current $I_{DT}$ 2117 is used during the leakage determination process (including determining the reference value) so that noise is accounted for. The threshold current is used to set a threshold for the leakage current. $I_{CM}$ and $I_{DT}$ were previously discussed in connection with FIG. 9A.

In one embodiment, the current being detected, whether for determining the reference value or for the leakage test, is mirrored and flows down the left side through the transistor 2205. The level VMON is at a high voltage and FLG, on the other side of the inverter 2201 is low, in one embodiment. The gate of the transistor 2205 is controlled by the 8-bit (in this example) DAC counter 2207 which starts from the high value (FF in hex) and decrements downward. (Alternately, it could start at the low end and increase, but starting high can have benefits in terms of settling times.) The count continues until the level at VMON is pulled above a trip point of FLG, at which point the counter value is stored into the latch register 2203. After doing this once to determine the reference values, the selected testing pattern is then applied and the process repeated, after which the results are compared to determine if the leakage current exceeds the allowed amount.

Threshold current $I_{DT}$ 2117 is one embodiment of threshold current generation 808 in FIG. 8, in one embodiment. Registers 2203 are one embodiment of register 812 of FIG. 8. Counter 2207 and other circuitry such as transistor 2205, and comparator 2201 are one embodiment of A/D conversion 810 of FIG. 8. Portions of block 2120 (e.g., transistors 2113) are one embodiment of voltage source connection/disconnection 802 of FIG. 8. Portions of block 2120 (e.g., transistors 2113, capacitor 2209, comparator 2201, transistor 2205) are one embodiment of current sensor 804 of FIG. 8. Portions of block 2120 (e.g., transistors 2113, capacitor 2209, comparator 2201, transistor 2205) and Block 2230 serve as one embodiment of current comparator of FIG. 8.

Figure 10B:
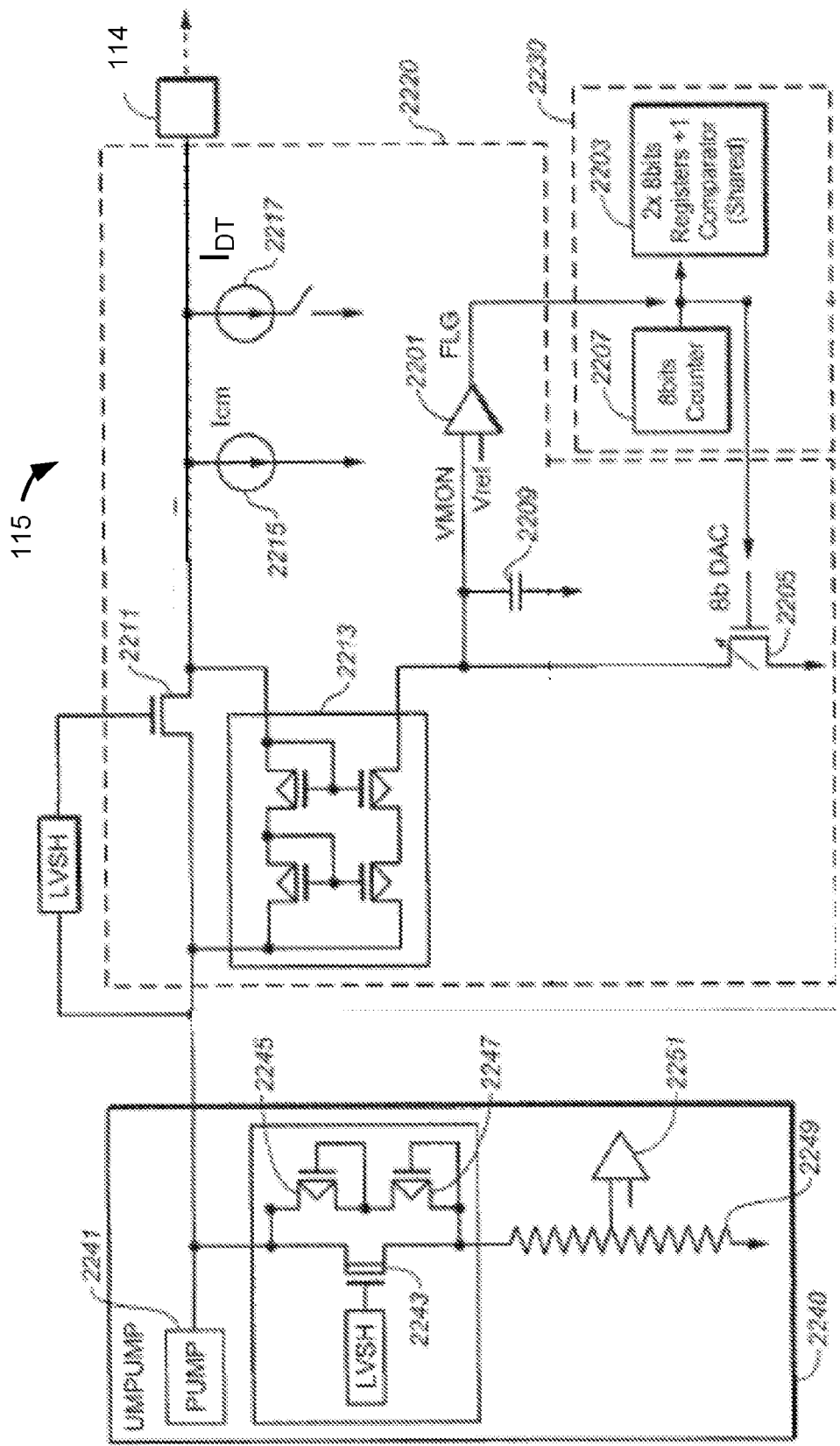

FIG. 10B shows one embodiment of a leakage detection circuit 115, connected to charge pump circuitry 2240. This is one embodiment of the leakage detection circuit of FIG. 8. In one embodiment, the leakage detection circuit 115 of FIG. 10B is used during the process of FIG. 9B. Leakage detection circuit 115 comprises block 2220 and block 2230. The charge pump circuitry 2240 supplies voltages (e.g., high voltages) used to apply the test voltages. For example, the charge pump circuitry 2240 could supply a voltage to be applied to a block select line 206. The charge pump system UMPUMP 2240 includes the pump 2241 itself that supplies the voltage used for testing and also a resistance 2249 and a comparator 2251 used to set and regulate the value of the voltage. The transistors in between will be discussed below. The voltage is then supplied to the leakage determination circuitry 2220 and 2230.

Block 2220 transfers the voltage from the charge pump system UMPUMP 2240 to the on chip addressing decoder 114, in one embodiment. There may be one or more components between block 2220 and the on chip addressing decoder 114 in order to provide the block select line voltage to the on chip addressing decoder 114.

The switch of high voltage transistor 2211 is used to by-pass the detection circuitry for normal operations by passing the block select voltage to the gate of 2211 by closing the circuit through LVSH. Similarly, during normal operations, the high level of LVSH is also applied to the gate of the high voltage switch of transistor 2243 and the pump system UMPUMP 2240 operates in its typical manner by-passing 2245 and 2247. During testing, both of 2211 and 2243 will be off.

During testing, rather than use the actual current, and thereby dilute but the measuring process, the current is mirrored by the current mirror 2213, here formed by two pairs of high voltage PMOSs. As some voltage is dropped across the path of the mirror 2213 between UMPUMP 2240 and the on chip address decoder 114, the two high voltage PMOSs 2245 and 2247 are used to replicate threshold voltage drop across the mirror.

The mirrored current is then used to detect the leakage, whether the reference value or the actual leakage test value.

Transistor 2205, comparator 2201 (here just represented as an inverter), counter 2207 and register 2203 are depicted. The comparator 2201 is shown to have as input a reference voltage Vref that could be supplied by, for example, a bandgap circuit. The capacitor 2209 smoothes out the VMON level. The block 2230, including counter 2207 and the register/comparator 2203, is shared between block. The counter/comparator 2203 may have a register (2 by 8-bits in this example) and a comparator.

Block 2220 also includes Icm 2215 as a common mode current source to set a minimum current flow through the current mirror to meet settling/detection time. The threshold current $I_{DT}$ 2217 is used during the leakage determination process (including determining the reference value) so that noise is accounted for. The threshold current is used to set a threshold for the leakage current.

Threshold current $I_{DT}$ 2117 is one embodiment of threshold current generation 808 in FIG. 8, in one embodiment. Registers 2203 are one embodiment of register 812 of FIG. 8. Counter 2207 and other circuitry such as transistor 2205, and comparator 2201 are one embodiment of A/D conversion 810 of FIG. 8. Portions of block 2220 (e.g., transistors 2213, 2211, LVSH) are one embodiment of voltage source connection/disconnection 802 of FIG. 8. Portions of block 2120 (e.g., transistors 2113, capacitor 2209, comparator 2201, transistor 2205) are one embodiment of current sensor 804 of FIG. 8. Portions of block 2120 (e.g., transistors 2213, capacitor 2209, comparator 2201, transistor 2205) and Block 2230 serve as one embodiment of current comparator of FIG. 8.

One embodiment disclosed herein includes a non-volatile storage device comprising a three dimensional memory array comprising a plurality of blocks of memory cells, a conductive region shared by at least one memory cell in each of the plurality of blocks, a block select line having a portion adjacent to a portion of the conductive region, the block select line coupled to a block of the plurality of blocks of memory cells, and a control circuit configured to detect a leakage current between the block select line and the conductive region.

In one embodiment, the conductive region of the previous paragraph comprises a plurality of local source lines and one or more global source lines that electrically connect the plurality of local source lines. The control circuit may be configured to detect an electrical short between the block select line and at least one of the one or more global source lines. The control circuit is configured to detect an electrical short between the block select line and at least one of the local source lines.

One embodiment disclosed herein includes a method that comprises storing data in non-volatile storage elements in a plane in the non-volatile storage device. The plane comprises a plurality of blocks of non-volatile storage elements. The plane has a common source line that comprises a local source line in each of the blocks. The source line has a global source line that electrical connects the local source lines of a multiple blocks in the plane. The plane has a plurality of block select lines. The method further comprises determining that a leakage current between a first block select line of the block select lines and the common source line is greater than a threshold. The method further comprises moving the data stored in the non-volatile storage elements in the plane to a different plane in the non-volatile storage device in response to determining that the leakage current is greater than the threshold.

One embodiment disclosed herein includes a non-volatile storage device, comprising a three dimensional memory array comprising a plurality of blocks of NAND strings over a substrate. The plurality of blocks comprising a first set of blocks and a second set of blocks in a plane. The non-volatile storage device also comprises a plurality of local source lines in the plane, and one or more global source lines that electrically connect the plurality of local source lines in the plane. The plurality of local source lines and the one or more global source lines form a common source line. The non-volatile storage device also comprises a first plurality of row decoders associated with the first set of blocks. Each row decoder in the first plurality of row decoders is associated with one of the blocks in the first set. The non-volatile storage device also comprises a second plurality of row decoders associated with the second set of blocks. Each row decoder in the second plurality of row decoders is associated with one of the blocks in the second set. The non-volatile storage device also comprises a first plurality of block select lines, each of which is associated with one of the first plurality of row decoders. The non-volatile storage device also comprises a second plurality of block select lines, each of which is associated with one of second plurality of row decoders. The non-volatile storage device also comprises a block decoder that receives an address of a memory operation, determines which of the plurality of blocks corresponds to the address, and provides select/unselect signals on the first and second plurality of block select lines in accordance with address. The non-volatile storage device also comprises a leakage detect circuit that detects leakage current between ones of the second plurality of block select lines and the common source line.

One embodiment disclosed herein includes a non-volatile storage device, comprising data storage means for storing data in non-volatile storage elements in a plane in the non-volatile storage device. The plane comprises a plurality of blocks of non-volatile storage elements. The plane has a common source line that comprises a plurality of local source lines that are electrically connected. Each of the plurality of blocks has at least one of the plurality of local source lines, the plane having a plurality of block select lines in close physical proximity to ones of the plurality of local source lines. The non-volatile storage device comprises leakage current detection means for determining that a leakage current between one of the block select lines and the common source line is greater than a threshold. The non-volatile storage device comprises data management means for moving the data stored in the non-volatile storage elements in the plane to a different plane in the non-volatile storage device in response to determining that the leakage current is greater than the threshold.

A data storage means for storing data in non-volatile storage elements in a plane in the non-volatile storage device, in various embodiments, state machine 112, on-chip address decoder 114, power control 116, controller 122, row decoders 124, column decoders 132, read/write circuits 128, and/or processor 122c. Other embodiments may include similar or equivalent data storage means for storing data in non-volatile storage elements in a plane in the non-volatile storage device.

A leakage current detection means for determining that a leakage current between one of the block select lines and the common source line is greater than a threshold, in various embodiments, leakage current detection 115, current sensor 804, threshold current generation 808, current comparator 806, analog to digital conversion 810, registers 812, voltage source connection/disconnection 802, state machine 112, power control 116, controller 122, and/or processor 122c. Other embodiments may include similar or equivalent data leakage current detection means for determining that a leakage current between one of the block select lines and the common source line is greater than a threshold.

A data management means for moving the data stored in the non-volatile storage elements in the plane to a different plane in the non-volatile storage device in response to determining that the leakage current is greater than the threshold, in various embodiments, state machine 112, on-chip address decoder 114, power control 116, controller 122, row decoders 124, column decoders 132, read/write circuits 128, and/or processor 122c. Other embodiments may include similar or equivalent data management means for moving the data stored in the non-volatile storage elements in the plane to a different plane in the non-volatile storage device in response to determining that the leakage current is greater than the threshold.

Corresponding methods, systems and computer- or processor-readable storage devices which have executable code for performing the methods provided herein may also be provided.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A non-volatile storage device, comprising:
    a three dimensional memory array comprising a plurality of blocks of memory cells;
    a common source line shared by at least one memory cell in each of the plurality of blocks;
    a block select line coupled to a block of the plurality of blocks of memory cells, the block select line having a portion extending over the block adjacent to a portion of the common source line; and
    a control circuit configured to detect a leakage current between the block select line and the common source line.

2. The non-volatile storage device of claim 1, wherein the control circuit is configured to move data stored in the plurality of blocks of memory cells to another location in the non-volatile storage device in response to detecting that the leakage current is greater than a threshold.

3. The non-volatile storage device of claim 1, wherein the plurality of blocks of memory cells reside in a plane on a memory die, the control circuit is configured to mark the plane unusable in response to detecting that the leakage current is greater than a threshold.

4. The non-volatile storage device of claim 1, wherein the common source line comprises a plurality of local source lines and one or more global source lines that electrically connect the plurality of local source lines, wherein the control circuit is configured to detect an electrical short between the block select line and at least one of the one or more global source lines.

5. The non-volatile storage device of claim 1, further comprising:
    a substrate that supports the plurality of blocks of memory cells, wherein the common source line comprises a plurality of local source lines each electrically connected to the substrate, wherein the control circuit is configured to detect an electrical short between the block select line and at least one of the local source lines.

6. The non-volatile storage device of claim 5, wherein each of the local source lines is plane shaped having a major side and a minor side, the major side extends vertically from the substrate, wherein the block select line extends over the minor side of a local source line that is physically close to the block select line.

7. The non-volatile storage device of claim 6, further comprising a plurality of source line contacts connected to the minor sides of the plurality of local source lines, wherein the block select line has a first portion that extends over the minor side of a first local source line of the plurality of local source lines, a second portion that extends over the minor side of a second local source line of the plurality of local source lines and a third portion that connects the first portion and the second portion in order to avoid the source line contacts.

8. The non-volatile storage device of claim 1, wherein the control circuit is configured to initiate a test of whether there is a leakage current between the block select line and the common source line after a plurality of program/erase cycles of the plurality of blocks of memory cells.

9. The non-volatile storage device of claim 1, wherein the control circuit is configured to:
    sink a current in response to a first voltage applied to the block select line and a second voltage applied to the common source line, wherein the first voltage has a different magnitude from the second voltage; and
    determine the leakage current between the block select line and the common source line based on the sunk current.

10. The non-volatile storage device of claim 1, wherein the control circuit is configured to distinguish between a leakage current between the block select line and the common source line and a leakage current between the common source line and a conductive element that is not a block select line.

11. The non-volatile storage device of claim 1, wherein the memory cells are NAND strings, the common source line is shared by at least one NAND string in each of the plurality of blocks.

12. A method comprising:
    storing data in non-volatile storage elements in a plane in a non-volatile storage device, the plane comprising a plurality of blocks of non-volatile storage elements, the plane having a common source line that comprises a local source line in each of the blocks, the common source line having a global source line that electrical connects the local source lines of a multiple blocks in the plane, the plane having a plurality of block select lines, each of the block select lines coupled to one of the plurality of blocks, a set of the block select lines extending over a top of the block to which the block select line is coupled and being adjacent to the global source line;
    determining that a leakage current between a first block select line of the block select lines and the common source line is greater than a threshold; and
    moving the data stored in the non-volatile storage elements in the plane to a different plane in the non-volatile storage device in response to determining that the leakage current is greater than the threshold.

13. The method of claim 12, wherein the determining that the leakage current between a first of the block select lines and the common source line is greater than the threshold comprises:
sinking a current in response to a first voltage applied to the first block select line and a second voltage applied to the common source line, the second voltage being lower in magnitude than the first voltage; and
determining the leakage current between the first block select line and the common source line based on the sunk current.

14. The method of claim 13, further comprising:
applying the second voltage to bit lines and word lines in the plane while sinking the current.

15. A non-volatile storage device, comprising:
a three dimensional memory array comprising a plurality of blocks of NAND strings over a substrate, the plurality of blocks comprising a first set of blocks and a second set of blocks in a plane;
a plurality of local source lines in the plane;
one or more global source lines that electrically connect the plurality of local source lines in the plane, the plurality of local source lines and the one or more global source lines forming a common source line;
a first plurality of row decoders associated with the first set of blocks, each row decoder in the first plurality of row decoders associated with one of the blocks in the first set;
a second plurality of row decoders associated with the second set of blocks, each row decoder in the second plurality of row decoders associated with one of the blocks in the second set;
a first plurality of block select lines, each of which is associated with one of the first plurality of row decoders, each of the first plurality of block select lines extends over a top of a block of the NAND strings and is adjacent to one or more of the global source lines;
a second plurality of block select lines, each of which is associated with one of second plurality of row decoders;
a block decoder that receives an address of a memory operation, determines which of the plurality of blocks corresponds to the address, and provides select/unselect signals on the first and second plurality of block select lines in accordance with address; and
a leakage detect circuit that detects leakage current between ones of the second plurality of block select lines and the common source line.

16. The non-volatile storage device of claim 15, further comprising:
a control circuit that:
stores data in ones of the plurality of blocks; and
moves the data from the ones of the plurality of blocks to another plane in the non-volatile storage device in response to the leakage current exceeding a threshold.

17. The non-volatile storage device of claim 15, wherein ones of the plurality of local source lines are plane shaped having a major side and a minor side, the major side extends vertically from the substrate.

18. The non-volatile storage device of claim 17, wherein ones of the second plurality of block select lines run in close proximity to the minor sides of the plurality of local source lines.

19. The non-volatile storage device of claim 17, further comprising a plurality of source line contacts that electrically connect the minor sides of the plurality of local source lines to the one or more global source lines, wherein ones of the second plurality of block select lines each have a first portion that extends over the minor side of a local source line, a second portion that extends over the minor side of an adjacent local source line, and a third portion that electrically connects the first portion to the second portion.

20. A non-volatile storage device, comprising:
data storage means for storing data in non-volatile storage elements in a plane in the non-volatile storage device, the plane comprising a plurality of blocks of non-volatile storage elements, the plane having a common source line that comprises a plurality of local source lines that are electrically connected, each of the plurality of blocks having at least one of the plurality of local source lines, the plane having a plurality of block select lines in close physical proximity to ones of the plurality of local source lines, ones of the plurality of block select lines extending over at least one of the plurality of blocks;
leakage current detection means for determining that a leakage current between one of the block select lines and the common source line is greater than a threshold; and
data management means for moving the data stored in the non-volatile storage elements in the plane to a different plane in the non-volatile storage device in response to determining that the leakage current is greater than the threshold.

* * * * *